United States Patent
Arelakis et al.

(10) Patent No.: US 10,831,655 B2
(45) Date of Patent: Nov. 10, 2020

(54) METHODS, DEVICES AND SYSTEMS FOR COMPRESSING AND DECOMPRESSING DATA

(71) Applicant: ZEROPOINT TECHNOLOGIES AB, Gothenburg (SE)

(72) Inventors: Angelos Arelakis, Gothenburg (SE); Per Stenström, Torslanda (SE)

(73) Assignee: ZEROPOINT TECHNOLOGIES AB, Gothenburg (SE)

( * ) Notice: Subject to any disclaimer, the term of this patent is extended or adjusted under 35 U.S.C. 154(b) by 156 days.

(21) Appl. No.: 16/072,317

(22) PCT Filed: Jan. 30, 2017

(86) PCT No.: PCT/SE2017/050078
§ 371 (c)(1),
(2) Date: Jul. 24, 2018

(87) PCT Pub. No.: WO2017/131579
PCT Pub. Date: Aug. 3, 2017

(65) Prior Publication Data
US 2019/0034091 A1    Jan. 31, 2019

(30) Foreign Application Priority Data

Jan. 29, 2016   (SE) .................................... 1650119
Jun. 1, 2016    (SE) .................................... 1650767

(51) Int. Cl.
*H03M 7/40*   (2006.01)
*G06F 12/0802*   (2016.01)
(Continued)

(52) U.S. Cl.
CPC .......... *G06F 12/0802* (2013.01); *G06F 3/064* (2013.01); *G06F 3/0608* (2013.01);
(Continued)

(58) Field of Classification Search
CPC ............. G06F 12/0802; G06F 12/0811; G06F 3/0659; G06F 3/0673; G06F 3/0608;
(Continued)

(56) References Cited

U.S. PATENT DOCUMENTS 5,410,671 A  *  4/1995   Elgamal ................. G06T 9/005
                                                      711/202
5,467,087 A      11/1995  Chu
(Continued)

FOREIGN PATENT DOCUMENTS

EP    1074945    2/2001
EP    1107117    6/2001
(Continued)

OTHER PUBLICATIONS

International Search Report and Written Opinion dated Mar. 20, 2017 by the International Searching Authority for Application No. PCT/SE2017/050078, filed Jan. 30, 2017, and published as WO 2017/131579 on Aug. 3, 2017 (Applicant—ZeroPoint Technologies AB) (10 pages).

(Continued)

*Primary Examiner* — Jean B Jeanglaude
(74) *Attorney, Agent, or Firm* — Ballard Spahr LLP

(57) ABSTRACT

Methods, devices and systems for a compressor and a decompressor for encoding and decoding data in the cache/memory/data transferring subsystem in a computer system or in a communication network are described herein. Example variable-length compressors and decompressors are able to: compress more densely when specific values occur in specific positions in a data block; to improve compression and decompression latency when specific values that appear frequently occur in a data block; to also improve decompression latency by recording the lengths of variable-length encoded values of a compressed data block.

(Continued)

The compressor and decompressor are able to support compression and decompression of common compression scenarios that are used in combination with variable-length compression to improve compressibility in the cache/memory/data transferring subsystem in a computer system or in a communication network.

59 Claims, 28 Drawing Sheets

(51) Int. Cl.
  *G06F 3/06* (2006.01)
  *G06F 12/0811* (2016.01)
(52) U.S. Cl.
  CPC .......... *G06F 3/0659* (2013.01); *G06F 3/0673* (2013.01); *G06F 12/0811* (2013.01); *H03M 7/40* (2013.01); *G06F 3/0656* (2013.01); *G06F 2212/401* (2013.01)
(58) Field of Classification Search
  CPC .. G06F 3/064; G06F 2212/401; G06F 3/0656; H03M 7/40; H03M 7/48; H03M 7/30; H04N 19/91; H04N 19/13
  USPC .............................................. 341/50, 51, 67
  See application file for complete search history.

(56) References Cited

U.S. PATENT DOCUMENTS

| | | | |
|---|---|---|---|
| 5,805,932 | A | 9/1998 | Kawashima et al. |
| 6,067,417 | A * | 5/2000 | Wise .................... G06F 9/3867 712/18 |
| 6,268,973 | B1 * | 7/2001 | Bickers ................. G06F 3/0608 360/48 |
| 7,190,284 | B1 | 3/2007 | Dye et al. |
| 7,403,136 | B2 | 7/2008 | De La Cruz et al. |
| 8,217,813 | B2 | 7/2012 | O'Connor |
| 8,300,823 | B2 | 10/2012 | Bojinov et al. |
| 8,497,788 | B1 | 7/2013 | Miller et al. |
| 8,898,117 | B2 | 11/2014 | Voll et al. |
| 9,363,339 | B2 | 6/2016 | Bhaskar et al. |
| 9,647,686 | B2 | 5/2017 | Master et al. |
| 9,652,152 | B2 | 5/2017 | Oportus Valenzuela et al. |
| 9,860,561 | B2 * | 1/2018 | Fenney ................. H04N 19/176 |
| 10,498,793 | B2 * | 12/2019 | Champion ............ H04L 65/607 |
| 2002/0097172 | A1 | 7/2002 | Fallon |
| 2002/0131084 | A1 | 9/2002 | Andrew et al. |
| 2003/0090709 | A1 | 5/2003 | Rijavec |
| 2003/0130855 | A1 | 7/2003 | Babu et al. |
| 2003/0196078 | A1 * | 10/2003 | Wise .................... G06F 9/3867 712/300 |
| 2006/0139188 | A1 | 6/2006 | Sasakura |
| 2008/0152235 | A1 | 6/2008 | Bashyam et al. |
| 2008/0228998 | A1 | 9/2008 | Colecchia et al. |
| 2009/0245382 | A1 | 10/2009 | Ekman |
| 2010/0058002 | A1 | 3/2010 | Voll et al. |
| 2013/0007076 | A1 | 1/2013 | Wegener |
| 2013/0272394 | A1 | 10/2013 | Brockmann et al. |
| 2013/0311722 | A1 | 11/2013 | Arelakis et al. |
| 2014/0002298 | A1 | 1/2014 | Funae |
| 2014/0101485 | A1 | 4/2014 | Wegener |
| 2015/0381203 | A1 | 12/2015 | Master et al. |
| 2016/0124659 | A1 | 5/2016 | Oportus Valenzuela et al. |
| 2016/0226518 | A1 | 8/2016 | Master et al. |
| 2017/0006139 | A1 * | 1/2017 | Kwon ................... H04L 1/0041 |
| 2017/0085916 | A1 * | 3/2017 | Fenney ............... H04N 19/176 |
| 2018/0138921 | A1 | 5/2018 | Arelakis et al. |
| 2018/0143770 | A1 | 5/2018 | Arelakis et al. |
| 2019/0034334 | A1 | 1/2019 | Arelakis et al. |
| 2020/0007150 | A1 * | 1/2020 | Lacey .................. H04N 19/132 |

FOREIGN PATENT DOCUMENTS

| | | |
|---|---|---|
| SE | 1650767 | 7/2017 |
| WO | WO-2011/033381 A1 | 3/2011 |
| WO | WO-2016/186563 A1 | 11/2016 |
| WO | WO-2016/186564 A1 | 11/2016 |
| WO | WO-2017/131578 A1 | 8/2017 |
| WO | WO-2017/131579 A1 | 8/2017 |

OTHER PUBLICATIONS

Office Action and Swedish Search Report dated Dec. 8, 2016 by the Swedish Patent and Registration Office for Application No. 1650767-5, filed Jun. 1, 2016, and published as SE 1650767 A1 on Jul. 30, 2017 (Applicant—ZeroPoint Technologies AB) (12 pages).

Arelakis, A., et al. "A case for a value-aware cache", IEEE Computer Architecture Letters, vol. 13, No. 1, pp. 1-4, Jan. 21, 2014; abstract; Sections 2 and 5.

Dusser, J. et al., Zero-content Augmented Caches. Proceedings of the 23rd International Conference on Supercomputing (ICS '09) (2009) (23 pages).

Isenburg M et al: "Lossless compression of predicted floating-point geometry", Computer Aided Design, vol. 37, No. 8, Jul. 1, 2005 (Jul. 1, 2005), pp. 869-877.

Islam, M., et al., "Characterizing and Exploiting Small-Value Memory Instructions," in IEEE Transactions on Computers, vol. 63, No. 7, pp. 1640-1655, Jul. 2014; abstract; Section 6.

Pekhimenko, G. et al., Base-Delta-Immediate Compression: Practical Data Compression for On-Chip Caches. Proceedings of the 21st International Conference on Parallel Architectures and Compilation Techniques (PACT '12) (2012) (12 pages).

Thuresson, M., et al., "Memory-Link Compression Schemes: A Value Locality Perspective," in IEEE Transactions on Computers, vol. 57, No. 7, pp. 916-927, Jul. 2008.; abstract; Sections 1, 3, and 6.

Wikipedia, "Floating-point arithmetic" URL: https://en.wikipedia.org/w/index.php?tide=Floatingpoint_arithmetic&oldid=661666669 [retrieved Nov. 30, 2018] (25 pages).

International Preliminary Report on Patentability dated Jul. 31, 2018 by the International Searching Authority for International Application No. PCT/SE2017/050078, filed on Jan. 30, 2017 and published as WO 2017/131579 on Aug. 3, 2017 (Applicant—Zeropoint Technologies AB)(7 Pages).

International Preliminary Report on Patentability dated Mar. 12, 2018 by the International Searching Authority for International Application No. PCT/SE2017/050074, filed on Jan. 27, 2017 and published as WO 2017/131578 on Aug. 3, 2017 (Applicant—Zeropoint Technologies AB)(6 Pages).

U.S. Appl. No. 15/575,007 (US-2018/0138921-A1), filed May 20, 2016 (May 17, 2018), Angelos Arelakis.

U.S. Appl. No. 15/575,072 (US-2018/0143770-A1), filed May 20, 2016 (May 24, 2018), Angelos Arelakis.

U.S. Appl. No. 16/072,328 (US-2019/0034334-A1), filed Jan. 27, 2017 (Jan. 31, 2019), Angelos Arelakis.

* cited by examiner

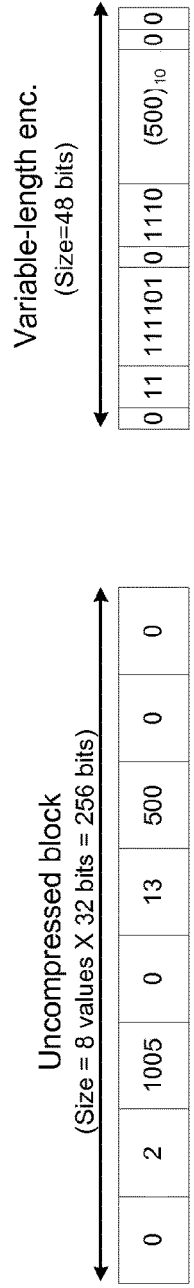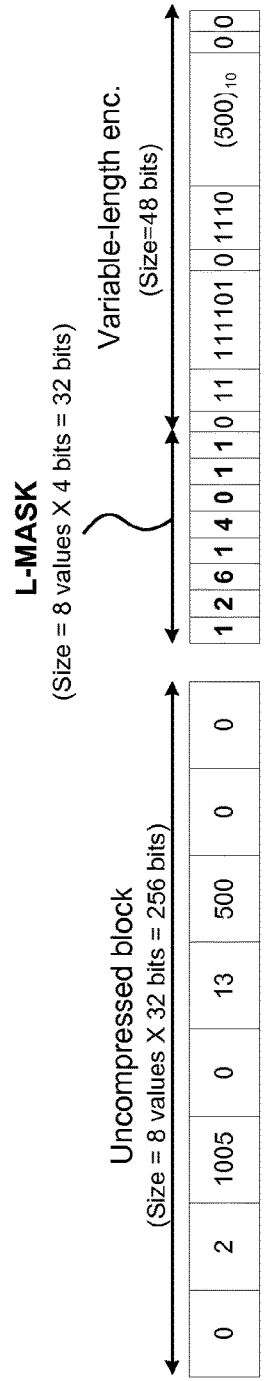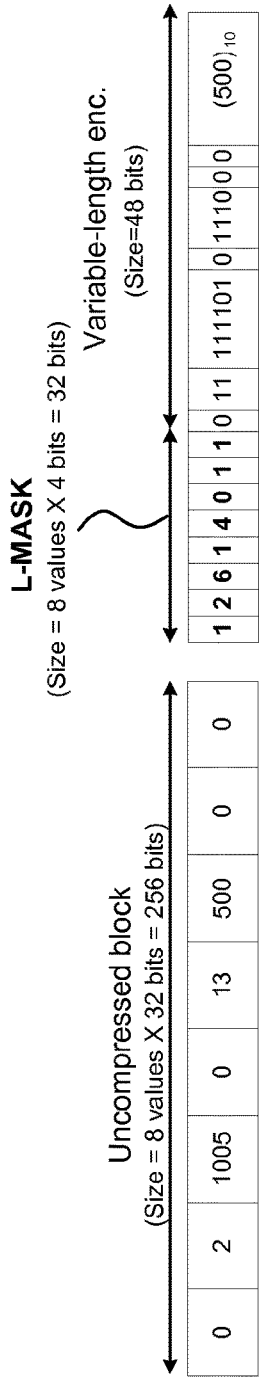

METHODS, DEVICES AND SYSTEMS FOR COMPRESSING AND DECOMPRESSING DATA

CROSS-REFERENCE TO RELATED APPLICATIONS

This application is a U.S. National Phase Application of International Application No. PCT/SE2017/050078, filed Jan. 30, 2017, which claims priority to Swedish Patent Application Nos. 1650119-9, filed Jan. 29, 2016, and 1650767-5, filed Jun. 1, 2016, each of which are hereby incorporated by reference in their entirety.

TECHNICAL FIELD

This disclosure generally relates to the field of data compression and decompression, for instance in a cache/memory subsystem and/or in a data transferring subsystem of a computer system, or in a data communication system.

BACKGROUND OF THE DISCLOSURE

Data compression is a well-established technique that is used to reduce the size of the data. It is applied to data that are saved in the memory subsystem of a computer system to increase the memory capacity. It is also used when data are transferred either between different subsystems within a computer system or in general when the transfer takes place between two points in a data communication system comprising a communication network.

Data compression requires two fundamental operations: 1) compression (also referred to as encoding) that takes as input uncompressed data and transform them to compressed data by replacing data values by respective codewords (also mentioned in the literature as encodings, codings or codes) and 2) decompression (also referred to as decoding) which takes as input compressed data and transform them to uncompressed by replacing the codewords with the respective data values. Data compression can be lossless or lossy depending on whether the actual data values after decompression are exactly the same to the original ones before being compressed (in lossless) or whether the data values after decompression are different than the original ones and the original values cannot be retrieved (in lossy). Compression and decompression can be implemented in software, or hardware, or a combination of software and hardware realizing the respective methods, devices and systems.

An example of a computer system 100 is depicted in FIG. 1. The computer system 100 comprises one or several processing units P1 . . . Pn connected to a memory hierarchy 110 using a communication means, e.g., an interconnection network. Each processing unit comprises a processor (or core) and can be a CPU (Central Processing Unit), a GPU (Graphics Processing Unit) or in general a block that performs computation. On the other hand, the memory hierarchy 110 constitutes the storage subsystem of the computer system 100 and comprises a cache memory 120, which can be organized in one or several levels L1-L3, and a memory 130 (a.k.a. primary memory). The memory 130 may also be connected to a secondary storage (e.g., a hard disk drive, a solid state drive, or a flash memory). The memory 130 can be organized in several levels, for example, a fast main memory (e.g., DDR) and a flash memory. The cache memory 120 in the current example comprises three levels, where the L1 and L2 are private caches as each of the processing units P1-Pn is connected to a dedicated L1/L2 cache, whereas the L3 is shared among all the processing units P1-Pn. Alternative examples can realize different cache hierarchies with more, fewer or no cache levels and with or without dedicating caches to be private or shared, various memory levels, with different number of processing units and in general different combinations between the processing units and the memory subsystem, as is all readily realized by a skilled person.

Data compression can be applied to a computer system in different ways. FIG. 2 depicts an example 200 of a computer system, like for instance system 100 of FIG. 1, where data are compressed in the memory, for example in the main memory of such computer system. This means that data are compressed before being saved in the memory by a respective compression operation as mentioned above, and data are decompressed when they leave the memory.

In an alternative example 300 of a computer system, shown in FIG. 3, data compression can be applied to the L3 cache of the cache system. Similarly to the previous example, compression is required before data are saved in the cache and decompression is required before data leave the cache (e.g., to other cache levels (L2) or to the memory 330 where data are uncompressed). In alternative examples data can be saved compressed in any level of the cache hierarchy.

Data can be also compressed only when they are transferred between different subsystems in the computer system. In the alternative example 400 of a computer system shown in FIG. 4, data are compressed when transferred between the L3 cache and the memory 430 using the respective communication means. Similarly to previous examples, compression and decompression need to exist in the ends of the communication means so that data are compressed before being transferred and decompressed when they are received at the other end.

In an alternative example 500 of a computer system, data compression can be applied in a combination of subsystems as depicted in FIG. 5. In this example, data are compressed when they are saved in the memory 530 and when they are transferred between the memory 530 and the cache hierarchy 520. In this way, when data are moved from the cache hierarchy 520 to the memory 530, they may only need to be compressed before being transferred from the L3 cache. Alternatively, the compressed data that leave the memory 530 to the cache hierarchy 520 may only need to be decompressed when they are received to the other end of the communication means that connect the memory 530 to the cache hierarchy 520. Regarding the combination of applying compression to the different subsystems in a computer system, any example is possible and can be realized by someone skilled in the art.

Transfer of data can also take place between two arbitrary points within a communication network. FIG. 6 depicts an example of a data communication system 600 comprising a communication network 605 between two points, where data are transferred by a transmitter 610 and received by a receiver 620. In such an example, these points can be two intermediate nodes in a network or the source and destination nodes of a communication link or a combination of these cases. Data compression can be applied to such a data communication system, as is depicted for an example system 700 in FIG. 7. Compression needs to be applied before data are transmitted by a transmitter 710 onto a communication network 705, while decompression needs to be applied after received by a receiver 720.

There is a variety of different algorithms to realize data compression. One family of data compression algorithms are the statistical compression algorithms, which are data dependent and can offer compression efficiency close to entropy because they assign variable-length (referred to also as variable-width) codes based on the statistical properties of the data values: short codewords are used to encode data values that appear frequently and longer codewords encode data values that appear less frequently. Huffman encoding is a known statistical compression algorithm.

A known variation of Huffman encoding that is used to accelerate decompression is canonical Huffman encoding. Based on this, codewords have the numerical sequence property meaning that codewords of the same length are consecutive integer numbers.

Examples of canonical Huffman-based compression and decompression mechanisms are presented in prior art. Such compression and decompression mechanisms can be used in the aforementioned examples to realize Huffman-based compression and decompression.

An example of a compressor 900 from the prior art, which implements Huffman encoding e.g., canonical Huffman encoding, is illustrated in FIG. 9. It takes as input an uncompressed block, which is a stream of data values and comprises one or a plurality of data values generally denoted v1, v2, . . . , vn throughout this disclosure. The unit 910, which can be a storage unit or an extractor of data value out from the uncompressed block, supplies the Variable-length Encoding Unit 920 with data values. The Variable-length Encoding Unit 920 comprises the Code Table (CT) 922 and the codeword (CW) selector 928. The CT 922 is a table can be implemented as a Look Up Table (LUT) or as a computer cache memory (of any arbitrary associativity) and contains one or a plurality of entries; each entry comprises a value 923 that can be compressed using a codeword, a CW 925 and a codeword-length (cL) 927. Because the set of the various codewords used by statistical compression algorithms is of variable-length, they must be padded with zeros when they are saved in the CT 922 where each entry has a fixed-size width (codeword 925). The codeword-length 927 keeps the actual length of the variable-length encoding (e.g., in bits). The CW selector 928 uses the cL in order to identify the actual CW and discard the padded zeros. The coded value is then concatenated to the rest of compressed values that altogether form the compressed block. An exemplary flow chart of a compression method that follows the compression steps as previously described is depicted in FIG. 27.

An example of a decompressor 1000 from the prior art is illustrated in FIG. 10. Canonical Huffman decompression can be divided into two steps: Codeword detection and Value retrieve. Each of these steps is implemented by a unit: (1) Codeword Detection Unit (CDU) 1020 and (2) Value Retrieve Unit (VRU) 1030. The aim of CDU 1020 is to find a valid codeword within a compressed sequence (i.e., the sequence of the codewords of the compressed data values). The CDU 1020 comprises a set of comparators 1022 and a priority encoder 1024. Each comparator 1022a,b,c compares each potential bit-sequence to a known codeword, which is in this example the First-assigned (at the time of code generation) canonical Huffman codeword (FCW) for a specific length. In alternative implementation, the last-assigned canonical Huffman codeword could be used too, but in that case the exact comparison made would be different. The maximum size of the aforementioned bit-sequence to be compared, which can be saved in a storage unit 1010 (implemented for example as a FIFO or flip flops) and which determines the number of comparators and the maximum width of the widest of them, depends on the maximum length of a valid Huffman codeword (mCL) that is decided at code generation. However, this maximum length can be bounded to a specific value at design, compile, configuration or run time depending on the chosen implementation of such decompressor (e.g., in software or in hardware). The output of the comparators 1022 is inserted into the priority encoder like structure 1024 which outputs the length of the matched codeword (referred to as "matched length" in FIG. 10). Based on this, the detected valid codeword (matched codeword) is extracted from the bit-sequence which is saved in a storage unit 1010; the bit sequence is shifted by as many positions as the "matched length" defines and the empty part is loaded with the next bits of the compressed sequence so that the CDU 1020 can determine the next valid codeword.

The Value Retrieve Unit (VRU) 1030, on the other hand, comprises the Offset table 1034, a subtractor unit 1036 and the Decompression Look Up Table (DeLUT) 1038. The "matched length" from the previous step is used to determine an offset value (saved in the Offset table 1034) that must be subtracted (1036) from the arithmetic value of the matched codeword, determined also in the previous step, to get the address of the DeLUT 1038 where the original data value that corresponds to the detected codeword can be retrieved from it and attached to the rest of decompressed values that are kept in the Decompressed block 1040. The operation of the decompressor is repeated until all the values that are saved compressed in the input compressed sequence (mentioned as compressed block in FIG. 10) are retrieved as uncompressed data values v1, v2, . . . , vn.

An exemplary flow chart of a decompression method that follows the decompression steps as previously described is depicted in FIG. 28.

The aforementioned compressor and decompressor can quickly and effectively compress blocks of data with variable-length canonical Huffman encoding and decompress blocks of data that are compressed with variable-length canonical Huffman encoding. However, the codeword detection phase during decompression is inherently sequential making decompression slow; although prior art teaches how to parallelize it, the implementation is complex and adds a lot of area overhead or demands a large amount of computation resources. This is a challenge when applying statistical compression to a computer system or a communication network of the aforementioned examples. Furthermore, although the aforementioned compressors of statistical compression algorithms can effectively compress the most frequent values, the decompressors work at the same speed irrespective of whether the compressed values are frequent or infrequent. In addition, the compressors are not very effective when said frequent values appear in standard positions in the stream of values. The present inventors have realized that there is room for improvements in the technical field of data compression and decompression.

SUMMARY OF THE DISCLOSURE

It is an object of the invention to offer improvements in the technical field of data compression and decompression.

This disclosure generally discloses methods, devices and systems for compressing a block of data values and decompressing a compressed block of data values, when compression is applied to for instance the cache subsystem and/or memory subsystem and/or data transferring subsystem in a computer system and/or a data communication system. There are various ways to compress data effectively in said subsystems using entropy-based variable-length encoding and one such way is by using Huffman encoding. Present compressors can be used to compress blocks of data values using Huffman encoding, while present decompressors can be used to decompress said blocks of data that are compressed with Huffman encoding. However, decompression of variable-length encoded sequences is inherently sequential and determining a Huffman-encoded data value in such a compressed block is slow as Huffman-encoded values are variable-length codewords; thus their boundaries are unknown. Moreover, the speed of present decompressors is the same irrespective of whether the compressed block comprises frequent or infrequent compressed values, while present compressors are not effective either when the most frequent values appear in standard locations/positions in the block. The disclosed methods, devices and systems in this disclosure enhance existing compressors and decompressors that utilize variable-length codings, with the following new features: to compress more densely when specific values occur in specific positions in a data block; to improve compression and decompression latency when specific values that appear frequently occur in a data block; to also improve decompression latency by recording the lengths of variable-length encoded values of a compressed data block. Furthermore, the presented methods, devices and systems enhance said compressors and decompressors even further by combining them with other aggressive compressors and decompressors, respectively, that target common compression scenarios in said computer system and communication network.

A first aspect of the present invention is a data compression device for compressing an uncompressed data block that comprises a number n of data values into a compressed data block, the data compression device comprising:
  a compressor configured to compress data values of the uncompressed data block into corresponding variable-length codewords;
  a detector configured to detect the presence of at least one specific data value in the uncompressed data block; and
  a compressed data block generator, coupled to the compressor and the detector and configured to generate the compressed data block by combining:
    a data value mask containing n mask positions, wherein each mask position is indicative of whether or not a respective data value in the uncompressed data block is equal to any of said at least one specific data value, as detected by said detector; and
    for data values in the uncompressed data block which are not equal to said at least one specific data value, the corresponding variable-length codewords as compressed by the compressor,
  wherein the compressed data block comprises the data value mask and m variable-length codewords, where m≤n, and wherein no variable-length codewords for data values in the uncompressed data block which are equal to any of said at least one specific data value are included in the compressed data block.

In some embodiments, the detector is configured to detect the presence of one specific data value in the uncompressed data block, wherein each of the n mask positions of the data value mask contains a single bit. In other embodiments, the detector is configured to detect the presence of a plurality of different specific data values in the uncompressed data block, wherein each of the n mask positions of the data value mask contains a fixed-size bit combination capable of encoding any of the plurality of specific data values.

In some embodiments, the or each specific data value is a frequently appearing data value which if instead using variable-length encoding could have been encoded with a minimum of bits. Advantageously, such a specific data value is 0 (zero). Alternatively, the or each of specific data value may be a data value that when occurring requires very fast decompression.

Further features of preferred embodiments of the data compression device according to the first aspect of the present invention are described with reference to FIGS. 16 and 18, and are moreover defined in the attached dependent claims 7-11 as filed herewith.

A second aspect of the present invention is a corresponding data compression method for compressing an uncompressed data block, that comprises a predetermined number n of data values, into a compressed data block, the data compression method comprising:
  compressing data values of the uncompressed data block into corresponding variable-length codewords;
  detecting the presence of at least one specific data value in the uncompressed data block; and
  generating the compressed data block by combining:
    a data value mask containing n mask positions, wherein each mask position is indicative of whether or not a respective data value in the uncompressed data block is equal to any of said at least one specific data value; and
    for data values in the uncompressed data block which are not equal to any of said at least one specific data value, the corresponding variable-length codewords,
  wherein the compressed data block comprises the data value mask and m variable-length codewords, where m≤n, and wherein no variable-length codewords for data values in the uncompressed data block which are equal to any of said at least one specific data value are included in the compressed data block.

The data compression method according to the second aspect of the present invention may include any or all of the functional features of the data compression device according to the first aspect of the present invention, including its embodiments.

A third aspect of the present invention is data decompression device for decompressing a compressed data block into a decompressed data block that comprises a number n of data values at respective data value positions, the data decompression device comprising:
  a decompressor configured to decompress variable-length codewords of the compressed data block into corresponding decompressed data values; and
  a decompressed data block generator configured to:
    read a data value mask containing n mask positions from the compressed data block, wherein each mask position is indicative of whether or not a respective data value in an uncompressed data block prior to data compression which produced the compressed data block was equal to any of at least one specific data value; and
    based on the data value mask, generate the decompressed data block by combining decompressed data values from the decompressor and said at least one specific data value as indicated by respective mask positions of the data value mask,
  wherein the order of the data values of the generated decompressed data block is the same as the order in which the data values appeared in the uncompressed data block prior to the data compression.

In some embodiments, each of the n mask positions of the data value mask contains a single bit indicative or non-indicative of one specific data value. In other embodiments, each of the n mask positions of the data value mask contains a fixed-size bit combination capable of decoding any of a plurality of specific data values. Advantageously, such a specific data value is 0 (zero).

Further features of preferred embodiments of the data decompression device according to the third aspect of the present invention are described with reference to FIGS. 17 and 19, and are moreover defined in the attached dependent claim 17 as filed herewith.

A fourth aspect of the present invention is a corresponding data decompression method for decompressing a compressed data block into a decompressed data block that comprises a number n of data values at respective data value positions, the data decompression method comprising:

decompressing variable-length codewords of the compressed data block into corresponding decompressed data values;

reading a data value mask containing n mask positions from the compressed data block, wherein each mask position is indicative of whether or not a respective data value in an uncompressed data block prior to data compression which produced the compressed data block was equal to any of at least one specific data value; and based on the data value mask, generating the decompressed data block by combining decompressed data values and said at least one specific data value as indicated by respective mask positions of the data value mask, wherein the order of the data values of the generated decompressed data block is the same as the order in which the data values appeared in the uncompressed data block prior to the data compression.

The data decompression method according to the fourth aspect of the present invention may include any or all of the functional features of the data decompression device according to the third aspect of the present invention, including its embodiments.

A fifth aspect of the present invention is a data compression device for compressing an uncompressed data block that comprises a number n of data values into a compressed data block, the data compression device comprising:

a compressor configured to compress data values of the uncompressed data block into corresponding variable-length codewords;

a detector configured to detect the presence of at least one specific data value in the uncompressed data block; and a compressed data block generator, coupled to the compressor and the detector and configured to generate a data value mask containing n mask positions, wherein each mask position is indicative of whether or not a respective data value in the uncompressed data block is equal to any of said at least one specific data value, as detected by said detector, wherein the compressed data block generator comprises a mask encoding generator configured to:

analyze the generated data value mask including determining whether it matches with any of a plurality of mask patterns; and generate a mask encoding to represent an outcome of the analysis;

wherein the compressed data block generator is further configured to generate the compressed data block by combining at least:

the generated mask encoding; and for data values in the uncompressed data block which are not equal to any of said at least one specific data value, the corresponding variable-length codewords as compressed by the compressor, wherein the compressed data block comprises the generated mask encoding and m variable-length codewords, where m≤n, and wherein no variable-length codewords for data values in the uncompressed data block which are equal to any of said at least one specific data value are included in the compressed data block, and wherein the compressed data block further comprises the data value mask, unless the outcome of the analysis by the mask encoding generator is that the generated data value mask indicates a predefined repetitive pattern of specific data values in the uncompressed data block.

Further features of preferred embodiments of the data compression device according to the fifth aspect of the present invention are described with reference to FIG. 18, and are moreover defined in the attached dependent claims 21-24 as filed herewith.

A sixth aspect of the present invention is a corresponding data compression method for compressing an uncompressed data block, that comprises a predetermined number n of data values, into a compressed data block, the data compression method comprising:

compressing data values of the uncompressed data block into corresponding variable-length codewords;

detecting the presence of at least one specific data value in the uncompressed data block;

generating a data value mask containing n mask positions, wherein each mask position is indicative of whether or not a respective data value in the uncompressed data block is equal to any of said at least one specific data value;

analyzing the generated data value mask including determining whether it matches with any of a plurality of mask patterns;

generating a mask encoding to represent an outcome of the analysis; and generating the compressed data block by combining at least:

the generated mask encoding; and for data values in the uncompressed data block which are not equal to any of said at least one specific data value, the corresponding variable-length codewords as compressed by the compressor, wherein the compressed data block comprises the generated mask encoding and m variable-length codewords, where 0≤m≤n, and wherein no variable-length codewords for data values in the uncompressed data block which are equal to any of said at least one specific data value are included in the compressed data block, and wherein the compressed data block further comprises the data value mask, unless the outcome of the analyzing step is that the generated data value mask indicates a predefined repetitive pattern of specific data values in the uncompressed data block.

The data compression method according to the sixth aspect of the present invention may include any or all of the functional features of the data compression device according to the fifth aspect of the present invention, including its embodiments.

A seventh aspect of the present invention is data decompression device for decompressing a compressed data block into a decompressed data block that comprises a number n of data values at respective data value positions, the data decompression device comprising:

a decompressor configured to decompress variable-length codewords of the compressed data block into corresponding decompressed data values; and a decompressed data block generator configured to:

read a mask encoding from the compressed data block, the mask encoding representing any of a plurality of mask patterns;

when the mask pattern represented by the read mask encoding does not indicate a predefined repetitive pattern of any of at least one specific data value in an uncompressed data block prior to data compression which produced the compressed data block, read a data value mask containing n mask positions from the compressed data block, wherein each mask position is indicative of whether or not a respective data value in the uncompressed data block prior to data compression was equal to any of said at least one specific data value; and based on the mask encoding, and the data value mask if applicable, generate the decompressed data block by combining decompressed data values from the decompressor and said at least one specific data value as indicated by the predefined repetitive pattern represented by the mask encoding, or as indicated by respective mask positions of the data value mask if applicable, wherein the order of the data values of the generated decompressed data block is the same as the order in which the data values appeared in the uncompressed data block prior to the data compression.

Further features of preferred embodiments of the data decompression device according to the seventh aspect of the present invention are described with reference to FIG. 19, and are moreover defined in the attached dependent claims 27-30 as filed herewith.

An eight aspect of the present invention is a corresponding data decompression method for decompressing a compressed data block into a decompressed data block that comprises a number n of data values at respective data value positions, the data decompression method comprising:

decompressing variable-length codewords of the compressed data block into corresponding decompressed data values;

reading a mask encoding from the compressed data block, the mask encoding representing any of a plurality of mask patterns;

when the mask pattern represented by the read mask encoding does not indicate a predefined repetitive pattern of any of at least one specific data value in an uncompressed data block prior to data compression which produced the compressed data block, reading a data value mask containing n mask positions from the compressed data block, wherein each mask position is indicative of whether or not a respective data value in the uncompressed data block prior to data compression was equal to any of said at least one specific data value; and based on the mask encoding, and the data value mask if applicable, generating the decompressed data block by combining decompressed data values and said at least one specific data value as indicated by the predefined repetitive pattern represented by the mask encoding, or as indicated by respective mask positions of the data value mask if applicable, wherein the order of the data values of the generated decompressed data block is the same as the order in which the data values appeared in the uncompressed data block prior to the data compression.

The data decompression method according to the eight aspect of the present invention may include any or all of the functional features of the data decompression device according to the seventh aspect of the present invention, including its embodiments.

A ninth aspect of the present invention is a data compression device for compressing an uncompressed data block that comprises a number n of data values into a compressed data block, the data compression device comprising:

a compressor configured to compress data values of the uncompressed data block into corresponding variable-length codewords, and output said variable-length codewords as well as respective code lengths thereof;

a compressed data block generator, coupled to the compressor and comprising a length mask register having n storage positions, one for each of the n data values of the uncompressed data block, the length mask register being configured for storing an n-position length mask, wherein the compressed data block generator is configured to store, at respective positions in the length mask, the respective code lengths of variable-length codewords as provided by the compressor, and wherein the compressed data block generator is configured to generate the compressed data block by combining:
the length mask stored in the length mask register; and
compressed data values in the form of the variable-length codewords as provided by the compressor.

In an advantageous embodiment, the data compression device further comprises a detector coupled to the compressor and configured to detect data values of the uncompressed data block that cannot be compressed by said compressor, wherein the compressed data block generator is configured to store, at a respective position in the length mask, a code length having a special value when the detector has detected that a data value of the uncompressed data block cannot be compressed, and store this data value uncompressed in the compressed data block. Advantageously, the special value of the code length is 0.

Further features of preferred embodiments of the data compression device according to the ninth aspect of the present invention are described with reference to FIG. 23 and are moreover defined in the attached dependent claims 33-39 as filed herewith.

A tenth aspect of the present invention is a corresponding data compression method for compressing an uncompressed data block that comprises a number n of data values into a compressed data block, the data compression method comprising:

compressing data values of the uncompressed data block into corresponding variable-length codewords, and outputting said variable-length codewords as well as respective code lengths thereof;

storing an n-position length mask in a length mask register having n storage positions, one for each of the n data values of the uncompressed data block, storing, at respective positions in the length mask, the respective code lengths of variable-length codewords, and generating the compressed data block by combining:
the length mask stored in the length mask register; and
compressed data values in the form of the variable-length codewords.

The data compression method according to the tenth aspect of the present invention may include any or all of the functional features of the data compression device according to the ninth aspect of the present invention, including its embodiments.

An eleventh aspect of the present invention is a data decompression device for decompressing a compressed data block into a decompressed data block that comprises a number n of data values at respective data value positions, the data decompression device comprising:

a decompressor configured to decompress variable-length codewords of the compressed data block into corresponding decompressed data values;

an extractor mechanism for reading an n-position length mask from the compressed data block, determining from the length mask respective code lengths of variable-length codewords in the compressed data block, extracting respective variable-length codewords from the compressed data block based on the determined respective code lengths, and providing the extracted respective variable-length codewords to the decompressor; and a decompressed data block generator configured to generate the decompressed data block from the decompressed data values from the decompressor, wherein the order of the data values of the generated decompressed data block is the same as the order in which the data values appeared in the uncompressed data block prior to data compression.

In an advantageous embodiment, the decompressed data block generator is configured to:

detect, for one or more positions in the length mask, one or more code lengths having a special value indicating that one or more corresponding data values is/are included in uncompressed form in the compressed data block; and based on the detected one or more code lengths having the special value, generate the decompressed data block by combining decompressed data values from the decompressor and the one or more corresponding data values in uncompressed form from the compressed data block.

Advantageously, the special value of code lengths is 0.

A twelfth aspect of the present invention is a data decompression method for decompressing a compressed data block into a decompressed data block that comprises a number n of data values at respective data value positions, the data decompression method comprising:

reading an n-position length mask from the compressed data block;

determining from the length mask respective code lengths of variable-length codewords in the compressed data block;

extracting respective variable-length codewords from the compressed data block based on the determined respective code lengths;

decompressing the extracted variable-length codewords into corresponding decompressed data values; and generating the decompressed data block from the decompressed data values, wherein the order of the data values of the generated decompressed data block is the same as the order in which the data values appeared in the uncompressed data block prior to data compression.

The data decompression method according to the twelfth aspect of the present invention may include any or all of the functional features of the data decompression device according to the eleventh aspect of the present invention, including its embodiments.

Another aspect of the present invention is system comprising one or more memories, a data compression device according to the first, fifth or ninth aspect above and a data decompression device according to the third, seventh or eleventh aspect above.

Still another aspect of the present invention is a computer program product comprising code instructions which, when loaded and executed by a processing device, cause performance of the method according to the second, sixth or tenth aspect above.

Yet another seventh aspect of the present invention is a computer program product comprising code instructions which, when loaded and executed by a processing device, cause performance of the method according to the fourth, eight or twelfth aspect above.

Other aspects, objectives, features and advantages of the disclosed embodiments will appear from the following detailed disclosure, from the attached dependent claims as well as from the drawings. Generally, all terms used in the claims are to be interpreted according to their ordinary meaning in the technical field, unless explicitly defined otherwise herein.

All references to "a/an/the [element, device, component, means, step, etc]" are to be interpreted openly as referring to at least one instance of the element, device, component, means, step, etc., unless explicitly stated otherwise. The steps of any method disclosed herein do not have to be performed in the exact order disclosed, unless explicitly stated.

BRIEF DESCRIPTION OF THE DRAWINGS

Examples from the background art as well as embodiments of inventive aspects are described with respect to the following figures:

FIG. 20 illustrates on the left an uncompressed block of data values (i.e. an uncompressed data block) and, on the right, the same block in compressed form (i.e. a compressed data block) using variable-length encoding that has been generated using Huffman coding.

FIG. 21 illustrates on the left an uncompressed data block and on the right the same block in compressed form in an alternative way comprising a bit mask, which keeps the lengths of the variable-length encodings of the compressed data values, and a variable-length encoding (i.e. a bit sequence encoded by variable-length encoding) that comprises a mix of compressed and uncompressed data values.

FIG. 22 illustrates on the left an uncompressed data block and on the right the same block in compressed form in an alternative way comprising a bit mask, which keeps the lengths of the variable-length encodings of the compressed values, and a variable-length encoding (i.e. a bit sequence encoded by variable-length encoding) that comprises a mix of compressed and uncompressed data values but where the uncompressed data values are stored in the end of the compressed data block in reverse order from the order of appearance in the original uncompressed data block.

DETAILED DESCRIPTION

The present disclosure discloses methods, devices and systems for compressing one or a plurality of blocks of data values and decompressing one or a plurality of compressed blocks of data values, when compression is applied to the cache subsystem and/or memory subsystem and/or data transferring subsystem in a computer system and/or a communication network. The disclosed methods, devices and systems extend and optimize baseline compression methods, devices and systems and decompression methods, devices and systems in order to be applicable for data compression cases that are common in the aforementioned applied systems, in terms of better compressibility and also in terms of higher compression/decompression speed.

Figure 1:
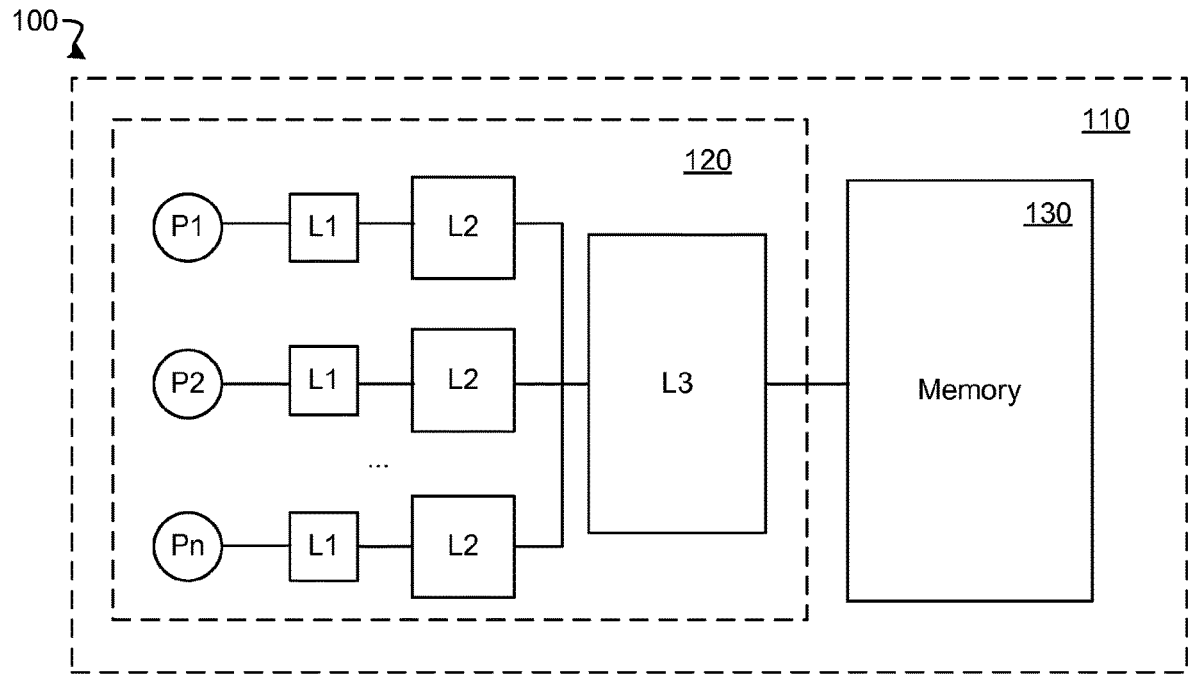
FIG. 1 illustrates a block diagram of a computer system that comprises n processing cores, each one connected to a cache hierarchy of three levels and the main memory.
Figure 2:
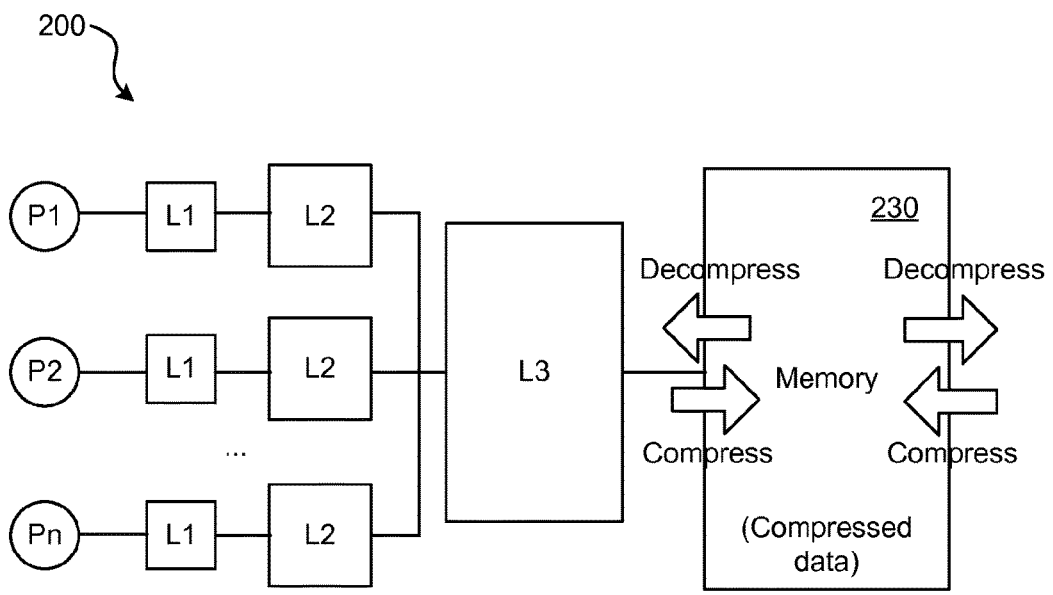
FIG. 2 illustrates the block diagram of FIG. 1, where the main memory saves data in compressed form.
Figure 3:
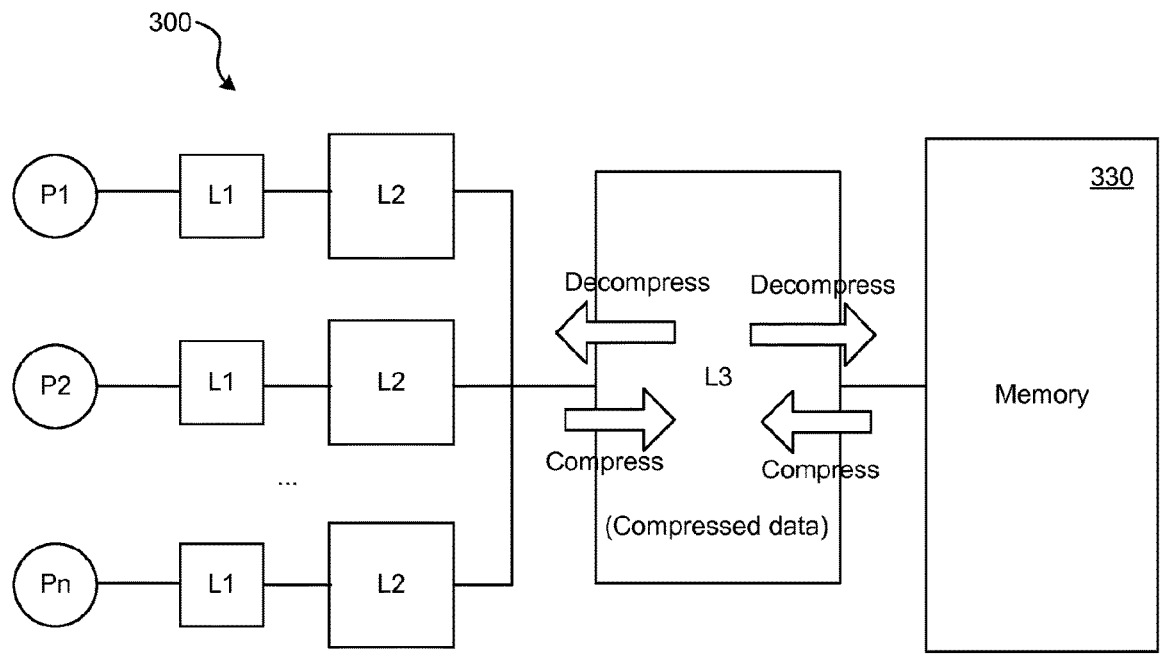
FIG. 3 illustrates the block diagram of FIG. 1, where the L3 cache saves data in compressed form. Other cache levels can also store data in compressed form.
Figure 4:
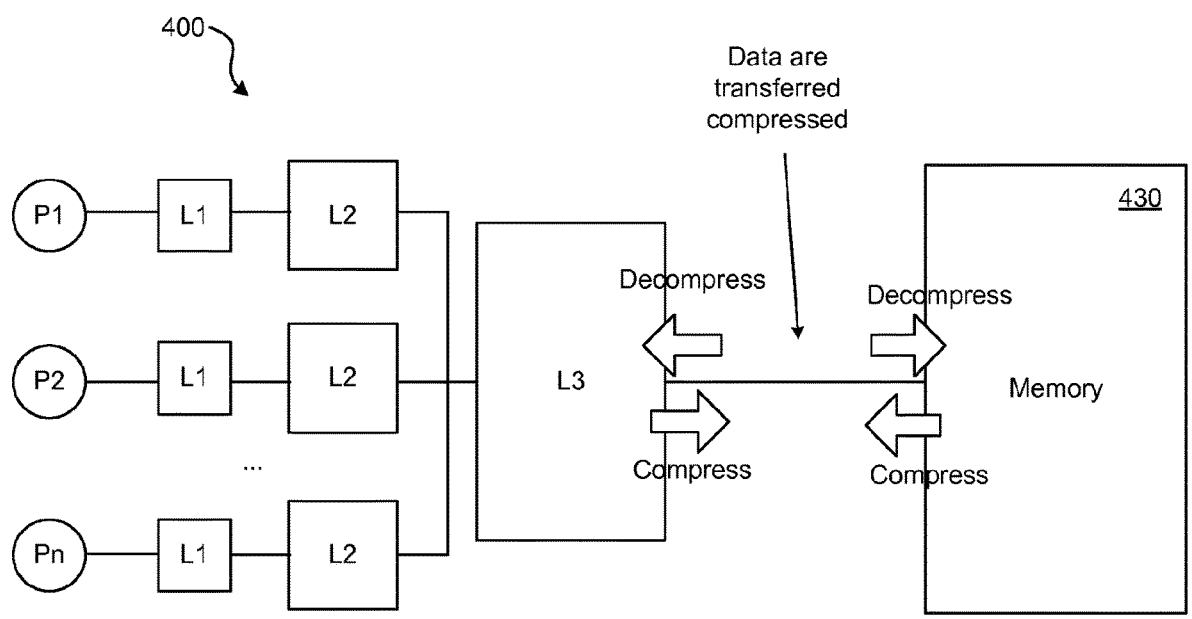
FIG. 4 illustrates the block diagram of FIG. 1 where data are compressed in a communication means, for example when transferred between the memory and the cache hierarchy.
Figure 5:
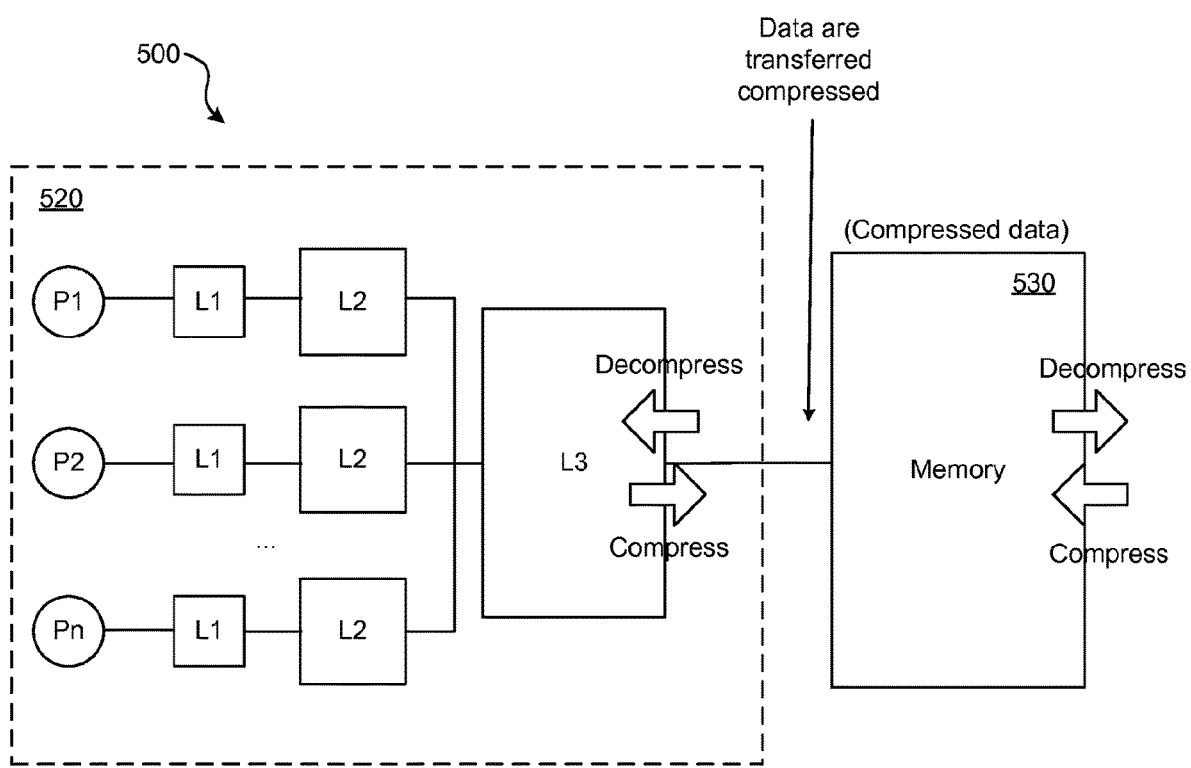
FIG. 5 illustrates the block diagram of FIG. 1 where compression can be applied to the main memory and the link that connects the memory to the cache hierarchy. In general compression can be applied to any combination of the parts like the cache hierarchy, the transferring means (e.g., link that connects the memory to the cache subsystem) and main memory.
Figure 6:
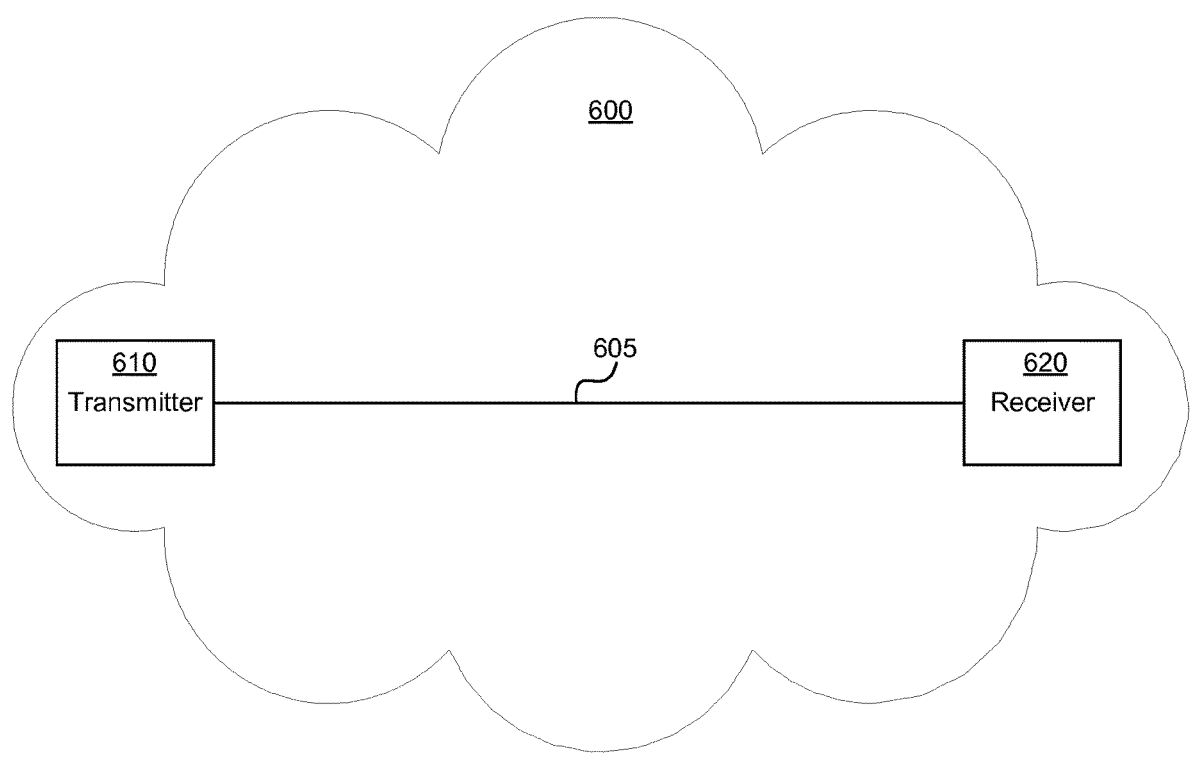
FIG. 6 illustrates a block diagram of a data transmission link that connects two points in a communication network. These points can be two intermediate nodes in the network or the source and destination nodes of a communication link or a combination of these cases.

A data block comprises one or a plurality of data values and can be of arbitrary size. In the embodiment of a computer system, as depicted in FIG. 1, a block of data values can be alternatively referred to as 1) a cache line, a cache set or a cache sector when the block of data is saved in the cache hierarchy, 2) as a cache line, a memory page or a memory sector when the block of data is saved in the memory or transferred in the communication means within such computer system. On the other hand, in the embodiment of a transmission link within a communication network as depicted in FIG. 6, a block of data may also refer to packet, flit, payload, header, etc.

Figure 7:
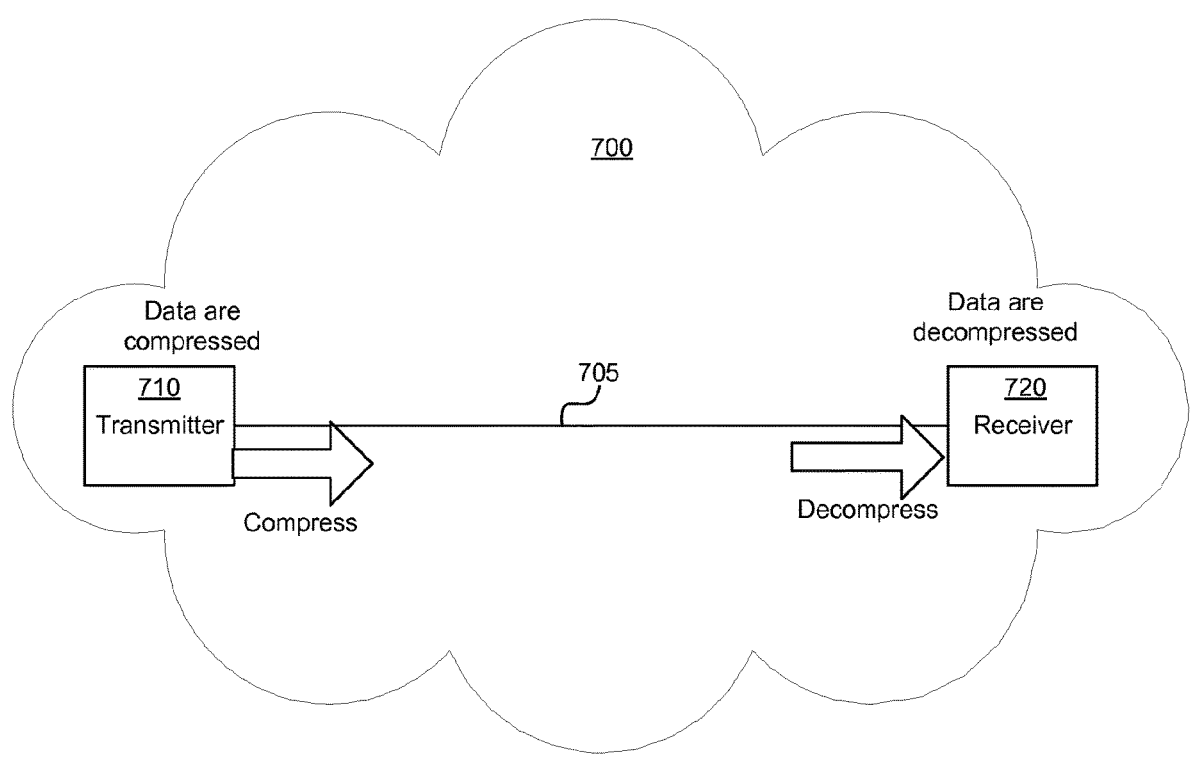
FIG. 7 illustrates a block diagram of the data transmission link of FIG. 6 where the data transferred are in compressed form so they may need to be compressed in the transmitter and decompressed in the receiver.
Figure 8:
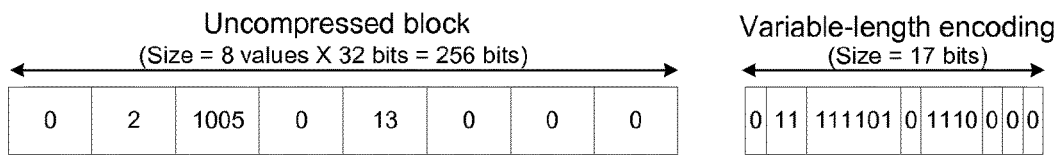
FIG. 8 illustrates on the left an uncompressed block of data values and, on the right, the same block in compressed form using variable-length encoding that has been generated using Huffman coding. All the data values of the uncompressed block are replaced by the respective Huffman codewords.
Figure 9:
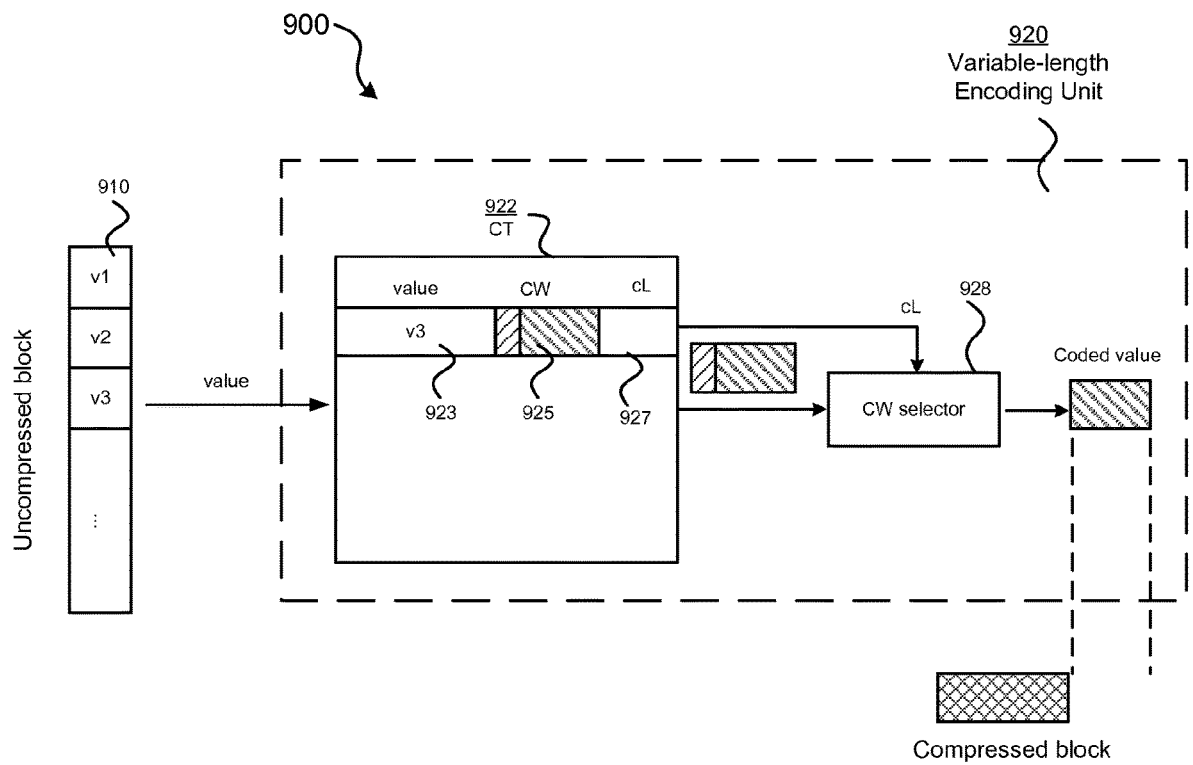
FIG. 9 illustrates a compressor that is used to compress (or encode) blocks using Huffman encoding, as illustrated in FIG. 8.

Variable-length entropy-based compression, such as Huffman compression, can be applied in the context of the cache/memory/data-transfer subsystems of an example computer system as depicted in FIG. 2, FIG. 3, FIG. 4, FIG. 5 or an example communication link as depicted in FIG. 7, to a block of data values as shown on the left of FIG. 8. Said block comprises 8 data values, however it can be of any arbitrary size as mentioned previously. All the data values in said block are compressed (or encoded) forming the compressed block, as depicted on the right of FIG. 8, using an example set of canonical Huffman codewords and a prior art Huffman compressor such as the example embodiment of FIG. 9. Furthermore, the example variable-length compressed block of data values is depicted on the right of FIG. 8 can be decompressed by a prior art canonical Huffman decompressor, such as the example embodiment of FIG. 10.

Figure 11:
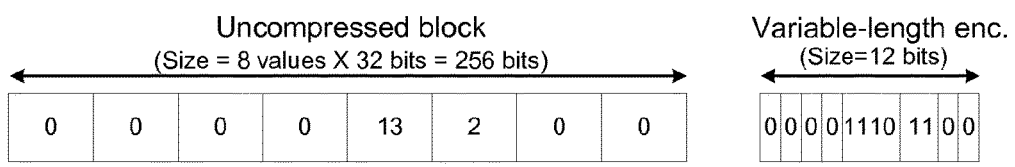
FIG. 11 illustrates on the left an uncompressed block of data values (i.e. an uncompressed data block) and, on the right, the same block in compressed form (i.e. a compressed data block) using variable-length encoding that has been generated using Huffman coding. All the data values of the uncompressed data block are replaced by the respective Huffman codewords in the compressed data block.

A common scenario when data compression is applied in the cache/memory subsystem or the transferring network subsystem or in a peer-to-peer communication network is that the specific data value 0 appears very frequently within a data block, but the data block is not entirely filled in with that specific data value 0. A conventional representation of such an uncompressed data block and the respective compressed data block using variable-length coding (e.g., Huffman coding), assuming that the data value 0 is encoded with a 1 bit codeword (best case), is depicted in FIG. 11. Pursuant to an embodiment of the present invention, an alternative representation of the uncompressed data block of FIG. 11 is presented in FIG. 12, where the compressed data block comprises a mask having width of X bits, where X is as large as the number of data values contained in a block (here 8), which precedes the variable-length encoding. The mask, that is referred to as Z-Value MASK, encodes the existence of said frequently appearing specific data values, such as the data value 0, in the compressed block thus omitting the example Huffman codeword in the variable-length encoding if such a zero data value exists in the uncompressed data block. This way the compressed data block is 2 bits (14 bits in total) larger than the embodiment of FIG. 21 (12 bits in total), however with such encoding decompression of the compressed block can be faster.

Figure 12:
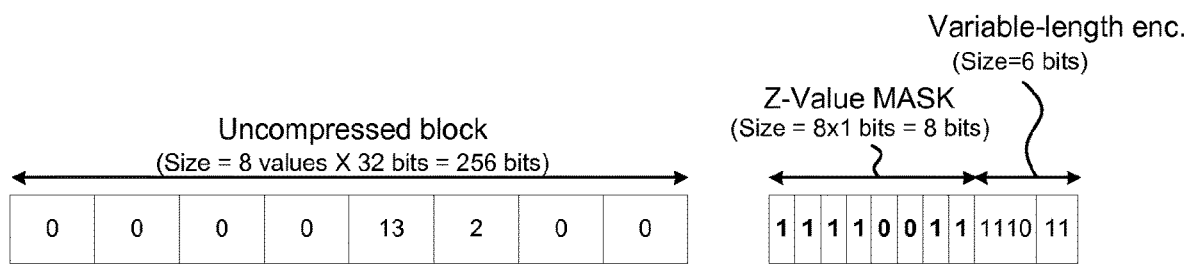
FIG. 12 illustrates on the left an uncompressed data block and on the right the same block in compressed form in an alternative way comprising a bit mask, which indicates which data values are zero and non-zero values, and a variable-length encoding (i.e. a bit sequence encoded by variable-length encoding) that comprises a mix of compressed non-zero data values.
Figure 16:
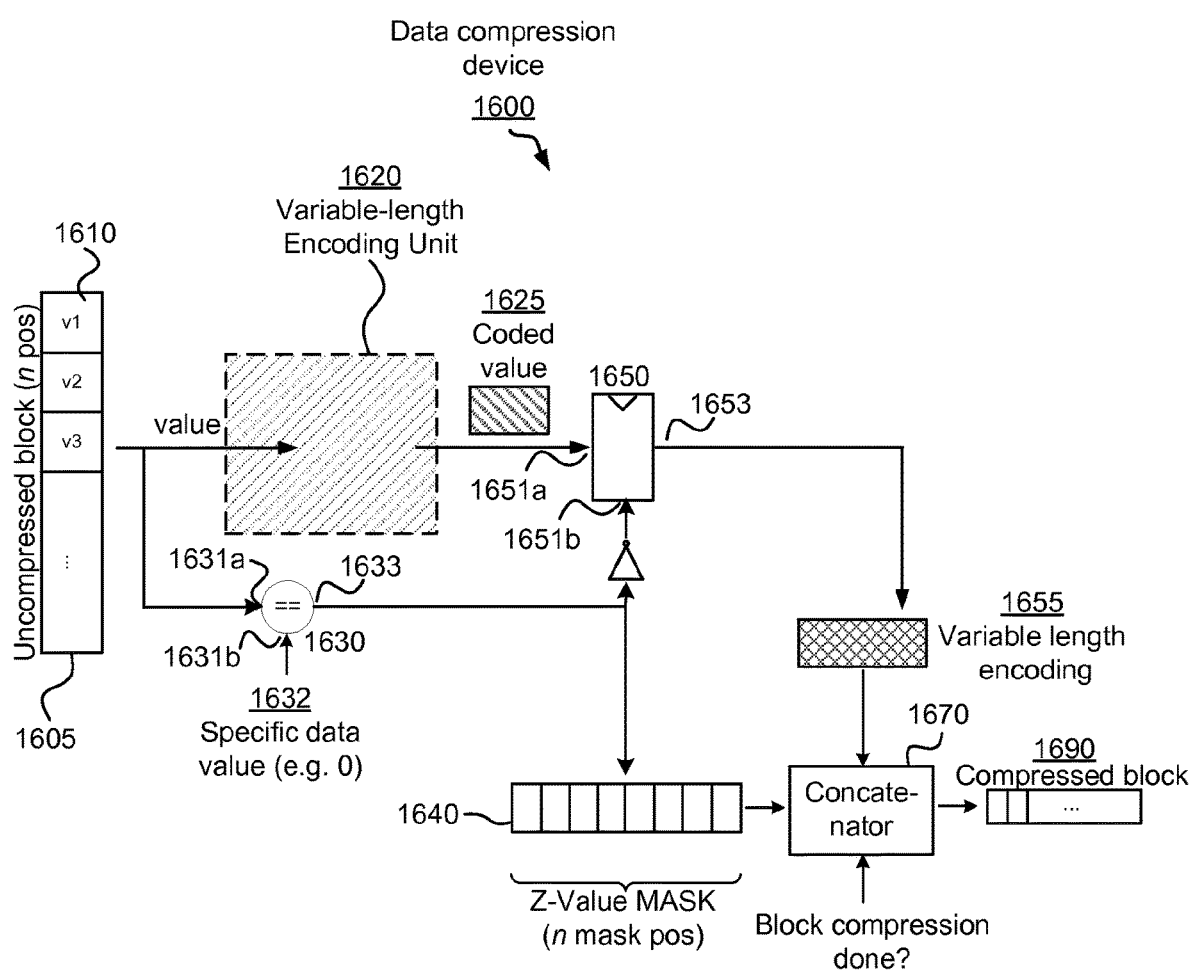
FIG. 16 illustrates a data compression device, based on the compressor of FIG. 9 but modified and extended to be able to compress the uncompressed data block of FIG. 12.

A block diagram of an example data compression device 1600 that is able to form said compressed data block of FIG. 12 is depicted in FIG. 16. It comprises a compressor in the form of a Variable-length Encoding Unit 1620, a detector 1630 in the form of a comparator, and a compressed data block generator 1640-1670 which includes a Z-Value MASK Register 1640 for storing the Z-Value MASK, a storage unit 1650 for storing a variable-length codeword 1625 as received from the Variable-length Encoding Unit (compressor) 1620, as well as a concatenator 1670. The data compression device 1600 takes as input an uncompressed data block 1610, which is a stream of data values and comprises one or a plurality of data values v1, v2, . . . , vn and which can be retrieved from a storage unit 1605 or an extractor of data values out from the uncompressed data block, as in the compressor embodiment of FIG. 9. However, the data values of the uncompressed data block 1610 are supplied not only to the Variable-length Encoding Unit 1620 but also to the comparator (detector) 1630, which compares whether the value is a zero value (i.e. a specific data value). If the value is non-zero, it is encoded using the unit 1620 and the coded value will be placed in an accumulated variable-length encoding 1635, while the outcome of the comparator 1630 ('0' for non-match) will be stored in the respective position in the Z-Value MASK 1640 (first position in the Z-Value MASK corresponds to first value in the block, etc). If the value is zero, then the outcome of the comparator 1630 ('1' for match) will disable the storage unit 1650 so that the coded value is omitted from the variable-length encoding 1635. Furthermore, the '1' is written in the respective position in the Z-Value MASK 1640, indicating a zero value. When the whole block is compressed (this can be implemented by one skilled in the art using a counter and comparing to the maximum number of values comprised in an uncompressed block), the Z-Value MASK is read from the Z-Value MASK register 1640 and is concatenated prior to the variable-length encoding 1635 forming the compressed block 1690 using the concatenator 1670. The storage unit 1650 can be implemented in a different way by one skilled in the art, for example, using a set of tri-state buffers.

Hence, in the data compression device 1600 in FIG. 16, the aforementioned detector comprises the comparator 1630 having a first input 1631a configured to receive a data value v1-vn at a respective data value position in the uncompressed data block 1610, a second input 1631b configured to receive the specific data value 1632, and an output 1633 configured to output a result of a comparison between the specific data value 1632 and the data value v1-vn at the respective data value position in the uncompressed data block 1610.

Moreover, in the data compression device 1600 in FIG. 16, the aforementioned compressed data block generator 1640-1670 comprises the mask register 1640 having n one-bit storage positions, one for each of the n mask positions of the data value mask. The output 1633 of the comparator 1630 is coupled to the mask register 1640, such that the mask register 1640 is updated at a respective one of its n storage positions with the result of the comparison between the specific data value 1632 and the data value v1-vn at the respective data value position in the uncompressed data block 1610.

Also, in the data compression device 1600 in FIG. 16, the aforementioned compressed data block generator 1640-1670 comprises the storage unit 1650 having a first input 1651a which is configured to receive from the compressor 1620 and to store in the storage unit 1650 a variable-length codeword 1625 corresponding to the data value v1-vn at the respective data value position in the uncompressed data block 1610. The storage unit 1650 also has an output 1653 configured to output the stored variable-length codeword 1625 into the accumulated variable-length encoding 1655, and a second input 1631b configured to receive a control signal being dependent on the output 1633 of the comparator 1630. The storage unit 1650 is configured to disable output of the stored variable-length codeword 1625 into the variable-length encoding 1655 when the result of the comparison by the comparator 1630 indicates a match between the specific data value 1632 and the data value v1-v*n* at the respective data value position in the uncompressed data block 1610.

Further, in the data compression device 1600 in FIG. 16, the aforementioned compressed data block generator 1640-1670 comprises the concatenator 1670 configured to generate the compressed data block 1690 by concatenating the data value mask Z-Value MASK from the mask register 1640 and the accumulated variable-length encoding 1655 when all n data values v1-v*n* of the uncompressed data block 1610 have been processed.

In the disclosed embodiment of the data compression device 1600 according to FIG. 16, the data value mask Z-Value MASK precedes the accumulated variable-length encoding 1655 in the compressed data block 1690. In other embodiments, the data value mask Z-Value MASK may instead be appended at the end of the accumulated variable-length encoding 1655 in the compressed data block 1690

The disclosure of FIG. 16 above can alternatively be seen as a device that compresses an uncompressed data block that comprises one or plurality of data values into a compressed block (i.e., a data compression device); where said compressed data block comprises a bit mask and a variable length bit sequence which further comprises one or a plurality of compressed data values encoded with variable-length encoding, where the number of compressed data values is less or equal to the number of uncompressed data values; where said device comprises: a compressor for compressing data values with variable-length codings that correspond to said data values; a first mechanism to detect one or a plurality of specific data values that will not be compressed by said compressor for compressing data values with variable-length codings; a second mechanism that uses the detection information of first mechanism to update a bitmask indicating said specific values.

Figure 17:
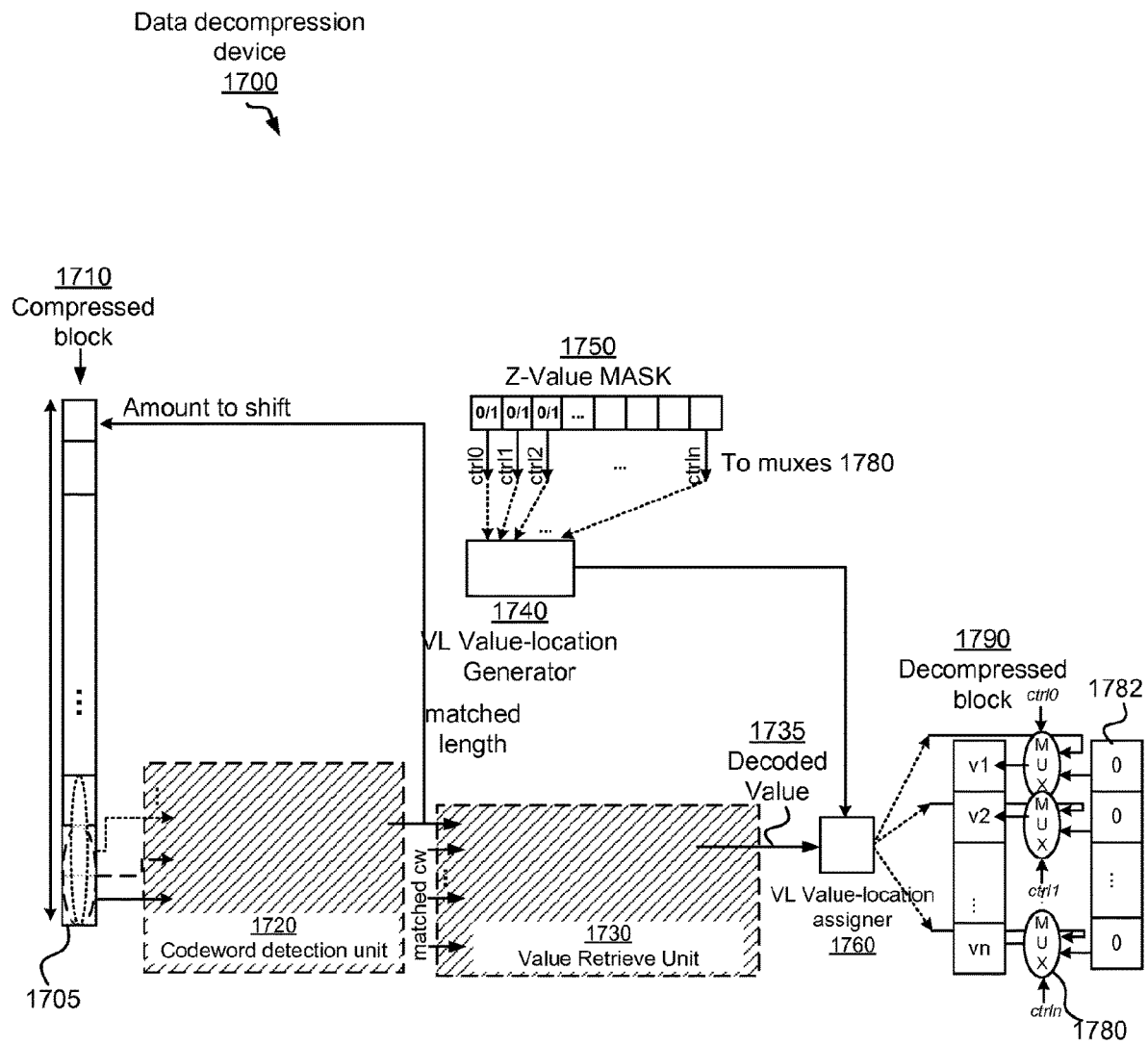
FIG. 17 illustrates a data decompression device, based on the decompressor of FIG. 10 but modified and extended to be able to decompress the compressed data block of FIG. 12.

A block diagram of an example data decompression device 1700 that is able to decompress said compressed block of FIG. 12 is depicted in FIG. 17. The data decompression device 1700 is built on the basis of the decompressor 1000 of FIG. 10 and comprises a storage unit 1705, which saves part of the compressed data block 1710 (the size of the storage unit 1710 is at least the maximum of the uncompressed value length and the maximum codeword length), a Codeword Detection Unit 1720 (similar to the Codeword Detection Unit 1020 of the decompressor 1000 of FIG. 10), a Value Retrieve Unit 1730 (similar to the Value Retrieve Unit 1030 of the decompressor 1000 of FIG. 10), and extra logic 1740-1780 which forms a decompressed data block generator. The Codeword Detection Unit 1720 and the Value Retrieve Unit 1730 thus form a decompressor.

The decompressed data block generator comprises a register 1750 for storing the Z-Value MASK as retrieved from the appended part of the compressed data block 1710, a Variable-Length (VL) Value-location Generator 1740, a Variable-Length (VL) Value-location Assigner 1760 and selectors 1780. The Z-Value MASK is used in two ways: 1) each Z-Value MASK bit is used to generate the control signals of the selectors 1780 so that if a data value has been encoded as zero-value (i.e. a specific data value), a zero is selected to be written instead in the decompressed block 1790; 2) all Z-Value MASK bits are used by the VL Value-location Generator 1740. The VL Value-location Generator generates the MASK indexes for all the non-zero values (indicated by the zero bit in the Z-Value MASK). For example, in the embodiment of FIG. 12, the non-zero values are marked in the Z-Value MASK indexes 5 and 6. This information is used by the VL Value-location Assigner 1760 to decide where to place each decoded (non-zero) value by the decompressor (v5 and v6 for the embodiment of FIG. 12).

Hence, the data decompression device 1700 of FIG. 17 accelerates the decompression of a compressed data block when some of the compressed data values it comprises is the data value 0 (or another most frequent data value), as it only needs to decompress the non-zero data values that are encoded with variable-length encoding.

As can be understood from the above, in the data decompression device 1700 in FIG. 17, the aforementioned decompressed data block generator 1740-1780 comprises the value location generator 1740, the value location assigner 1760, and the plurality of selectors 1780, one for each of the n data value positions of the decompressed data block 1790. The value location generator 1740 is configured to control the value location assigner 1760 and the plurality of selectors 1780, such that when a respective mask position of the data value mask Z-Value MASK indicates the specific data value 1782, the specific data value 1782 is received from the respective selector and included in the decompressed data block 1790 at the respective data value position, and such that when the respective mask position of the data value mask Z-Value MASK does not indicate the specific data value 1782, a corresponding decompressed data value is received from the decompressor 1720-1730 and is included in the decompressed data block 1790 at the respective data value position.

The disclosure of FIG. 17 above can alternatively be seen as a device that decompresses a compressed data block into one or plurality of data values (i.e., a data decompression device); where said compressed data block comprises a bit mask and a variable length bit sequence which further comprises one or a plurality of compressed data values encoded with variable-length encoding and one or a plurality of specific values encoded in the bitmask; where said device comprises: a decompressor for decompressing variable-length codings to reconstruct data values that correspond to said variable-length codings; a first mechanism to read a bit mask to determine whether specific values occurred during compression and generate the value positions in the uncompressed block, and a second mechanism that uses indications from first mechanism to recreate said specific data values so that order of values in decompressed data block is same as the order of values in original data block before compression.

In an alternative embodiment, another very frequent specific data value can be encoded like the data value 0 by a skilled person. In yet another alternative embodiment, more frequent data values can be encoded within a MASK using fixed-size encodings. For example, the 3 most frequent data values may be encoded with 00, 01, 10, leaving 11 to represent a non-frequent (or less frequent) data value that is encoded with variable-length encoding. The plurality of said specific data values can be detected by an alternative embodiment where the comparator 1630 or 1830 of data compression devices 1600 and 1800, respectively, is replaced by a small dictionary that contains a plurality of said specific values. Alternative embodiments can be realized by one skilled in the art.

Figure 13:
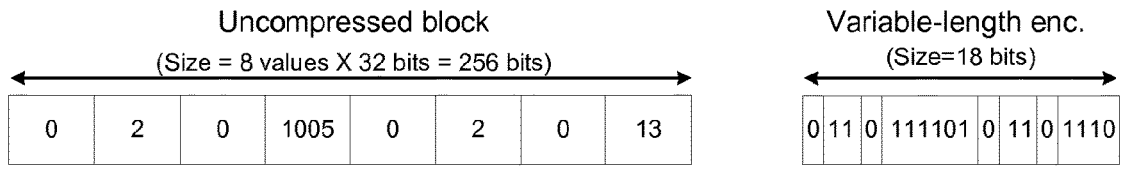
FIG. 13 illustrates on the left an uncompressed block of data values and, on the right, the same block in compressed form using variable-length encoding that has been generated using Huffman coding. All the data values of the uncompressed data block are replaced by the respective Huffman codewords in the compressed data block.
Figure 14:
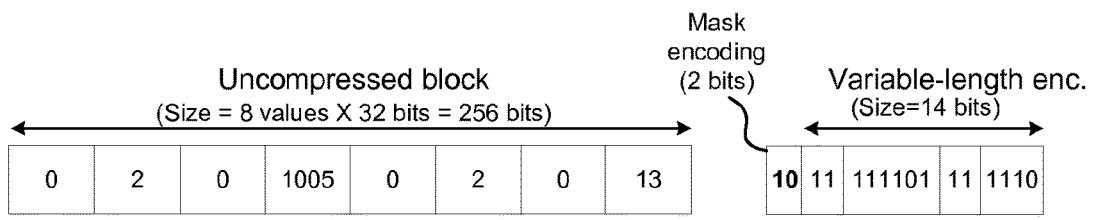
FIG. 14 illustrates on the left an uncompressed data block and on the right the same block in compressed form in an alternative way, comprising a mask encoding, which indicates whether a bit mask is comprised in said compressed block or whether zero and non-zero data values appear in a specific order or follow a specific pattern, and a variable-length encoding (i.e. a bit sequence encoded by variable-length encoding) that comprises a mix of compressed non-zero data values.

FIG. 13 shows a representation of an uncompressed data block (on the left of FIG. 13) and the respective compressed block (on the right of FIG. 13) using variable-length Huffman encoding. The uncompressed block of FIG. 13 is a common case where the specific data value 0 appears in the even index positions of block (assuming that the index of the first value is 0, second value 1, etc). This can happen if the data values of the block are small integer values which are declared as large integers. Similarly the specific data value 0 could appear consistently in the odd index positions of the block. Pursuant to an embodiment of the present invention, FIG. 14 shows an alternative way of compressing the uncompressed block of FIG. 13, where the scenario of having a 0 value every two data values (where the first data value of the block is 0) is encoded using 2 bits (10) and the rest of non-zero data values are compressed as previously described. This way, compression is improved by 2 bits (16 bits in total) when compared to the representation of the compressed block of FIG. 13 (18 bits in total). In order to be able to encode such different compression scenarios as well as the uncompressed block of the embodiment of FIG. 12, a mask encoding is required prior to the mask (if any). For example, with a 2-bit mask encoding we can encode the following pattern scenarios: 00→No mask follows (no zero values in the data block); 01→The value 0 appears every two data values, and the data block does not start with the value 0 (zero value in odd positions); 10→The value 0 appears every two data values and the data block starts with the value 0 (zero value in even positions); 11→The value 0 appears one or a plurality of times and cannot be likely described using a pattern. Therefore, this 2-bit encoding may add more bits to a compressed data block or can result in better compression (01 and 10 patterns), but in any case it can accelerate decompression by adding a small number of resources.

Figure 15:
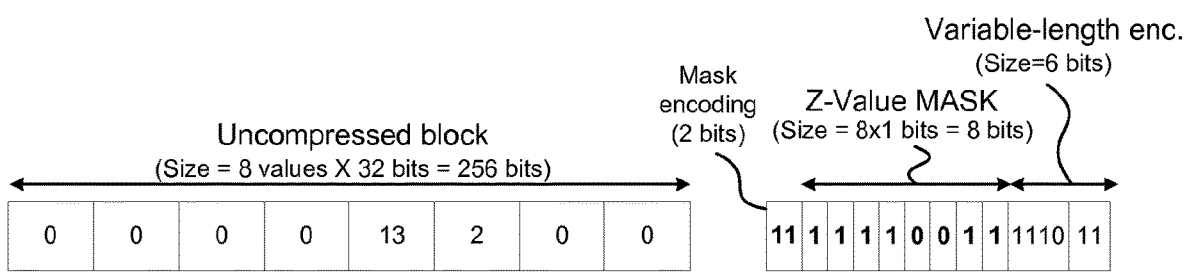
FIG. 15 illustrates on the left an uncompressed data block and on the right the same block in compressed form in an alternative way, comprising a mask encoding which indicates whether a bit mask follows or not, a bit mask which indicates which values are zero and non-zero values and a variable-length encoding (i.e. a bit sequence encoded by variable-length encoding) that comprises a mix of compressed non-zero data values.
Figure 18:
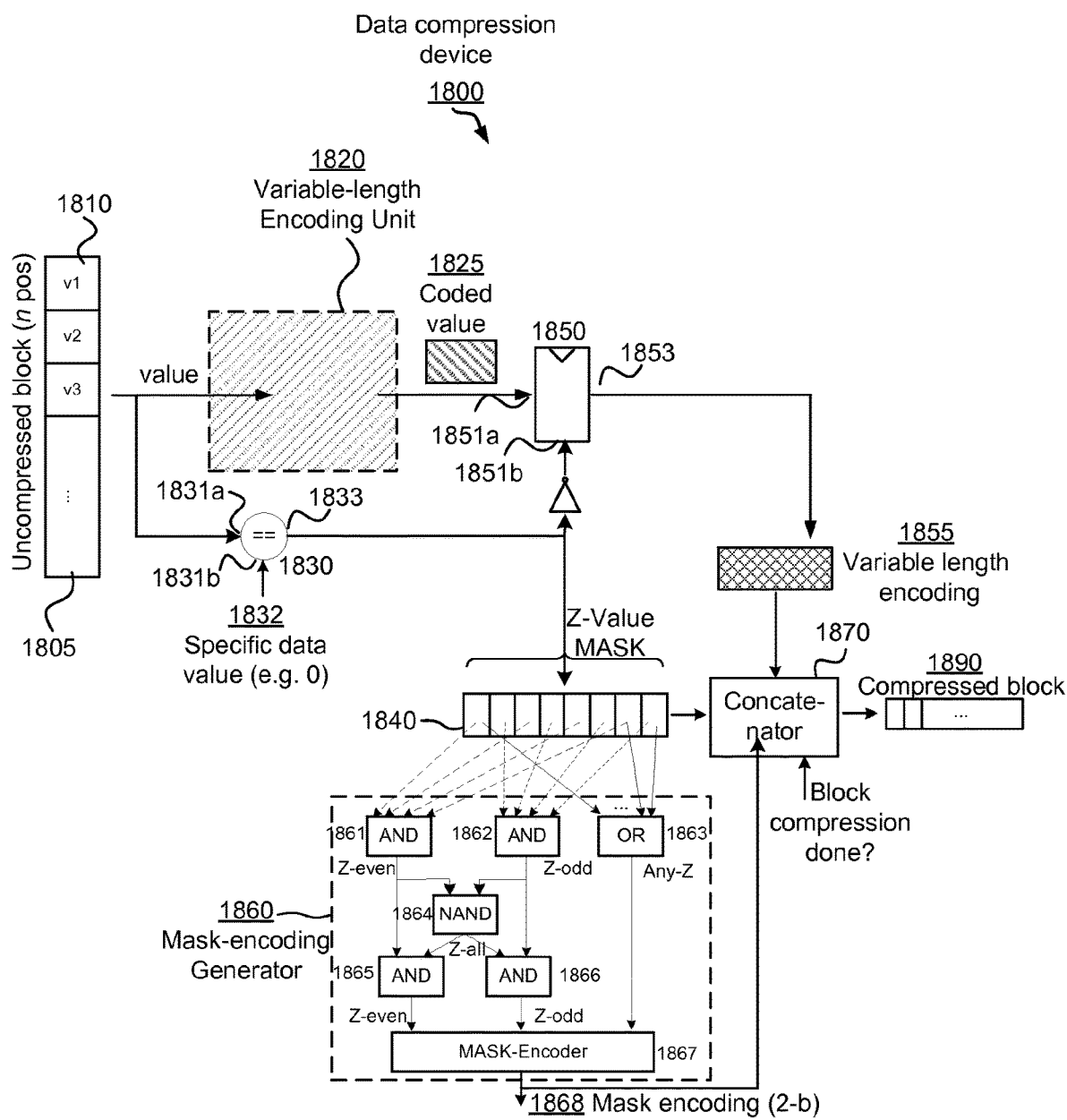
FIG. 18 illustrates a data compression device, based on the compression device of FIG. 16 but modified and extended to be able to compress the uncompressed data blocks of FIGS. 14 and 15.

A block diagram of an example data compression device 1800 that is able to form said compressed blocks of FIG. 14 and FIG. 15 is depicted in FIG. 18. Like the compression device of FIG. 16, it comprises a compressor in the form of a Variable-length Encoding Unit 1820, a Z-Value MASK Register 1840 for storing the Z-Value MASK, other logic 1830 and 1850, a compressed data block generator 1870, and a Mask-encoding generator 1860. Compression of zero (even if they appear to follow a pattern such as in FIG. 14) and non-zero data values is performed in the same way as the data compression device 1600 of FIG. 16 until block compression is done. At this point, the Z-Value MASK Register 1840 supplies the Z-Value MASK to the Mask-encoding generator 1860. Said generator 1860 comprises in this example embodiment Boolean logic that tries to identify if a specific pattern occurs with respect to the zero value (Z-even and Z-odd), or if any zero value has occurred (Any-Z). These signals are used by the MASK encoder 1867 to generate a respective Mask encoding 1868. Note that if all the data values in the data block (of e.g., 8 values, i.e. n=8) are zero values, this data block is compressed as "1111111111", where the first 2 bits is the mask encoding and rest of 8 bits is the Z-Value MASK. If this is the case, the logic 1864-1866 turns Z-odd and Z-even to '0', otherwise they remain set/unset based on the logic 1861 and 1862. If no zero value is comprised in the data block, the Z-even, Z-odd and Any-Z will be '0', generating this way a "00" mask encoding 1868. Furthermore, the concatenator 1870 checks the mask encoding 1868: if it is "00", "01" or "10" the mask encoding 1868 is attached prior to the variable length encoding 1835, otherwise the mask encoding 1868 precedes the Z-Value MASK which in turn precedes the variable length encoding 1835. Except for the Mask-encoding generator 1860 and its sub-components, and an extra input to the concatenator 1870 and its additional functionality as described above, the components 18nn of the data compression device 1800 in FIG. 18 may be the same as the corresponding components 16nn of the data compression device 1600 in FIG. 16, sharing the same last two digits nn in their reference numerals.

As can be understood from the above, in the data compression device 1800 in FIG. 18, the aforementioned mask encoding generator 1860 may be configured to generate the mask encoding 1868 to have a first mask encoding value when the generated data value mask Z-Value MASK indicates a predefined repetitive pattern of specific data values (e.g. zero data values) at every second data value position in the uncompressed data block 1810, wherein only the mask encoding 1868 but not the data value mask Z-Value MASK is included in the generated compressed data block 1890.

The mask encoding generator 1860 may also be configured to generate the mask encoding 1868 to have a second mask encoding value when the generated data value mask Z-Value MASK indicates a predefined repetitive pattern of specific data values (e.g. zero data values) at every second data value position in the uncompressed data block 1810, however at a one-position offset with respect to the predefined repetitive pattern of the first mask encoding value, wherein only the mask encoding 1868 but not the data value mask Z-Value MASK is included in the generated compressed data block 1890.

The mask encoding generator 1860 may furthermore be configured to generate the mask encoding 1868 to have a third mask encoding value when the generated data value mask indicates presence of a specific data value in at least one data value position in the uncompressed data block, wherein the mask encoding 1868 as well as the data value mask Z-Value MASK is included in the generated compressed data block 1890. Alternatively, the mask encoding generator 1860 may be configured to generate the mask encoding 1868 to have the third mask encoding value when the generated data value mask Z-Value MASK indicates a predefined repetitive pattern of specific data values (e.g. zero data values) at every data value position in the uncompressed data block 1810, wherein only the mask encoding 1868 but not the data value mask Z-Value MASK is included in the generated compressed data block 1890.

The mask encoding generator 1860 may moreover be configured to generate the mask encoding 1868 to have a fourth mask encoding value when the generated data value mask Z-Value MASK indicates absence of specific data values in all data value positions in the uncompressed data block 1810, wherein only the mask encoding 1868 but not the data value mask Z-Value MASK is included in the generated compressed data block 1890, Alternatively, the mask encoding generator 1860 may be configured to generate the mask encoding 1868 to have the fourth mask encoding value when the generated data value mask Z-Value MASK does not indicate any of the predefined repetitive patterns of the first, second or third mask encoding values, wherein the mask encoding 1868 as well as the data value mask Z-Value MASK is included in the generated compressed data block 1890.

Advantageously, the mask encoding 1868 may precede the m variable-length codewords in the compressed data block 1890, wherein the data value mask Z-Value MASK, if any, may be provided after the mask encoding 1868 and before the m variable-length codewords in the compressed data block 1890. Other relative orders are however also possible between the mask encoding 1868 and the m variable-length codewords, as well as the data value mask Z-Value MASK, if any, in the compressed data block 1890.

The disclosure of FIG. 18 above can alternatively be seen as a device that compresses an uncompressed data block that comprises one or plurality of data values into a compressed block (i.e., a data compression device); where said compressed data block comprises a mask encoding, a bit mask and a variable length bit sequence which further comprises one or a plurality of compressed data values encoded with variable-length encoding, where the number of compressed data values is less or equal to the number of uncompressed data values; where said device comprises: a compressor for compressing data values with variable-length codings that correspond to said data values; a first mechanism to detect one or a plurality of specific data values that will not be compressed by said compressor for compressing data values with variable-length codings; a second mechanism that uses the detection information of first mechanism to update a bitmask indicating said specific values; a third mechanism that looks for specific patterns with respect to said specific data values and generates said mask encoding; and a fourth mechanism that uses information from second and third mechanism to generate the compressed block using mask encoding, bit mask and variable-length encoding.

Figure 19:
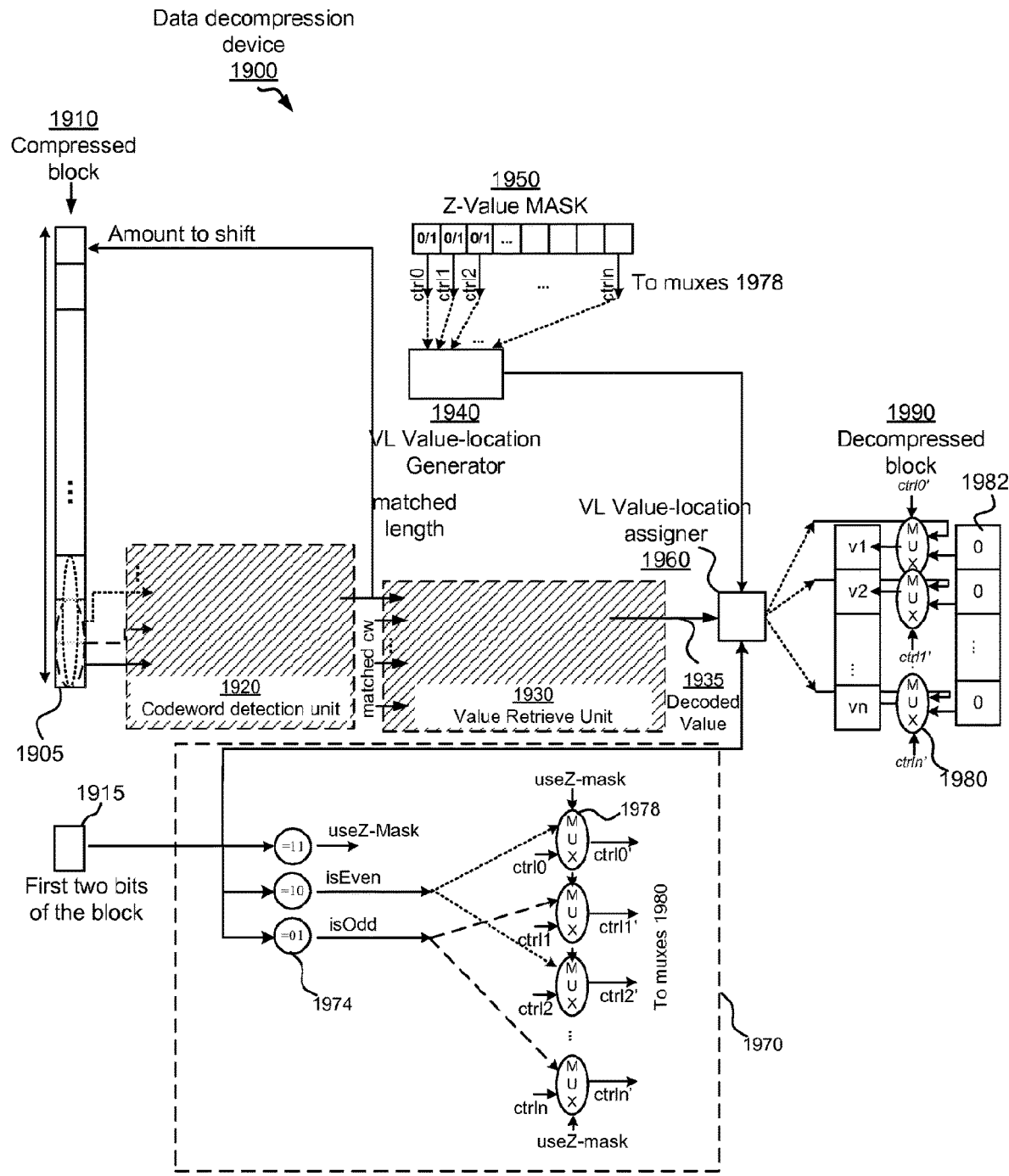
FIG. 19 illustrates a data decompression device, based on the decompression device of FIG. 17 but modified and extended to be able to decompress the compressed data blocks of FIGS. 14 and 15.

A block diagram of an example data decompression device 1900 that can decompress said compressed data blocks of FIG. 14 and FIG. 15 is depicted in FIG. 19. The data decompression device 1900 is built on the basis of the decompressor 1000 of FIG. 10 similarly to the data decompression device 1700 of FIG. 17. Like that data decompression device 1700, data decompression device 1900 comprises a storage unit 1905, which saves part of the compressed data block 1910 (the size of the storage unit 1910 is at least the maximum of the uncompressed value length and the maximum codeword length), a Codeword Detection Unit 1920, a Value Retrieve Unit 1930 extra logic 1940-1960 and 1980 which are included in a decompressed data block generator 1940-1980 that moreover comprises a mask encoding decoder 1970. The Codeword Detection Unit 1720 and the Value Retrieve Unit 1730 thus form a decompressor.

The decoder 1970 comprises comparators 1974 and selectors 1978, and generates the control signals of the selectors 1980 based on the Mask encoding 1915. Unlike the data decompression device 1700, the data decompression device 1900 starts by inspecting the first two bits of the block (i.e. the Mask encoding 1915). If it is "11", the next 8 bits of the compressed block are extracted from the storage unit 1905 and copied to the Z-Value MASK 1950. The content of the MASK is used to the VL Value-location Generator 1940 (as in the device of FIG. 17) and to feed the selectors 1978 of the Decoding unit 1970. The Assigner 1960 and the selectors 1980 work as follows:

If the mask encoding 1915 is "00" (no Z-Value MASK exists), the decoded values 1935 output from the Unit 1930 of the decompressor feed the selectors 1980 whose control signals ctrl0', ctrl1', etc are set to '0'. This happens because in this case, useZ-mask, isEven and isOdd in the Decoding unit 1970 are set to '0'. As a result the selectors 1978 will select the first input (either isEven or isOdd), which is '0'.

If the mask encoding 1915 is "01" (Z-odd, no Z-Value MASK exists), the decoded values 1935 output from the Unit 1930 of the decompressor feed the selectors 1980 in the even positions (v1, v3, v5, etc), while the selectors 1980 in the odd positions (with control signals ctrl1', ctrl3', etc) select the value 0 (i.e. the specific data value 1982). This means that ctrl0', ctrl2', etc are set to '0' and ctrl1', ctrl3', etc are set to '1'. This happens because in this case, useZ-mask is '0', isEven is '0' and isOdd is '1' in the Decoding unit 1970. As a result, the selectors 1978 will select the first input (either isEven or isOdd), leading to '0' for ctrl0', ctrl2', etc and '1' for ctrl1', ctrl3', etc.

If the mask encoding 1915 is "10" (Z-even, no Z-Value MASK exists), the decoded values 1935 output from the Unit 1930 of the decompressor feed the selectors 1980 in the odd positions (v2, v4, v6, etc), while the selectors 1980 in the even positions (with control signals ctrl0', ctrl2', etc) select the value 0 (i.e. the specific data value 1982). This means that ctrl0', ctrl2', etc are set to '1' and ctrl1', ctrl3', etc are set to '0'. This happens because in this case, useZ-mask is '0', isEven is '1' and isOdd is '0' in the Decoding unit 1970. As a result, the selectors 1978 will select the first input (either isEven or isOdd), leading to '1' for ctrl0', ctrl2', etc and '0' for ctrl1', ctrl3', etc.

If the mask encoding 1915 is "11" (Z-Value MASK exists), the decoded values 1935 output from the Unit 1930 of the decompressor feed the selectors 1980 in the positions as determined by the Unit 1940, as in the decompression device 1700, where the control signals ctrl0', ctrl1', etc of the selectors 1980 are equal to the control signals ctrl0, ctrl1, etc. This happens because in this case, useZ-mask is '1', isEven is '0' and isOdd is '0' in the Decoding unit 1970. As a result, all the selectors 1978 will select the second input (ctrl0, ctrl1, etc), which is the outputs of the Z-Value MASK.

As can be understood from the above, in the data decompression device 1900 in FIG. 19, the aforementioned decompressed data block generator 1940 may be configured, when the read mask encoding 1915 has a first mask encoding value, to generate the decompressed data block 1990 by combining decompressed data values 1935 from the decompressor 1920-1930 and said at least one specific data value 1982 (e.g. zero data value) in a predefined repetitive pattern with specific data values at every second data value position in the decompressed data block 1990.

Furthermore, the decompressed data block generator 1940 may be configured, when the read mask encoding 1915 has a second mask encoding value, to generate the decompressed data block 1990 by combining decompressed data values 1935 from the decompressor 1920-1930 and said at least one specific data value 1982 (e.g. zero data value) in a predefined repetitive pattern with specific data values at every second data value position in the decompressed data block (1990), however at a one-position offset with respect to the predefined repetitive pattern of the first mask encoding value.

Also, the decompressed data block generator 1940-1980 may be configured, when the read mask encoding 1915 has a third mask encoding value, to generate the decompressed data block 1990 to contain said at least one specific data value 1982 (e.g. zero data value) at every data value position in the decompressed data block 1990.

Additionally, the decompressed data block generator 1940-1980 may be configured, when the read mask encoding 1915 has a fourth mask encoding value, to generate the decompressed data block 1990 by combining decompressed data values 1935 from the decompressor 1920-1930 and said at least one specific data value 1982 (e.g. zero data value), as indicated by the respective mask positions of the data value mask Z-Value MASK.

Alternative implementation of this new decompressor embodiment can be realized by someone skilled in the art. Alternative implementations can be also realized by someone skilled in the art, if another value that appears more frequently than the value 0 is used instead of the value 0.

The disclosure of FIG. 19 above can alternatively be seen as a device that decompresses a compressed data block into one or plurality of data values (i.e., a data decompression device); where said compressed data block comprises a mask encoding, a bit mask and a variable length bit sequence which further comprises one or a plurality of compressed data values encoded with variable-length encoding and one or a plurality of specific values encoded in the bitmask; where said device comprises: a decompressor for decompressing variable-length codings to reconstruct data values that correspond to said variable-length codings; a first mechanism that decodes mask encoding, a second mechanism to read a bit mask to determine whether specific values occurred during compression and generate the value positions in the uncompressed block, a third mechanism that uses indications from first and second mechanisms to recreate said specific data values so that order of values in decompressed data block is same as the order of values in original data block before compression.

The aforementioned embodiments of data compression devices (1000, 1700 and 1900) have in common that the codewords of unknown lengths need to be found in the variable-length sequence of bits that constitutes the compressed data block and extracted from it. This is done by the Codeword Detection Unit 1020, 1720 and 1920. Codeword detection is an inherently sequential process as decoding of one compressed data value in the sequence of bits (that constitutes the compressed data block) requires to decompress (decode) all the previously occurred compressed data values in said sequence. Example decompressors tackle this problem by building a hierarchy of codeword detection units that are aligned in different bit positions of the incoming compressed bit sequence or a part of it, so that a followed codeword is selected among many predicted ones based on the outcome of the codeword detection unit of the previous level. Such embodiments add substantial resources due to multiple sets of comparators and priority encoders which add up the area cost and power dissipation.

On the other hand, the codeword detection step can be avoided entirely if the length of each variable-length codeword is known in advance. A representation of a data block compressed with variable-length Huffman encoding is depicted in FIG. 20. An alternative representation pursuant to an embodiment of the present invention is depicted in FIG. 21, where a mask (L-MASK) of the length values of the variable-length codewords are stored prior to the sequence of variable-length codewords (variable-length encoding). Each length value has fixed size which depends on the maximum size of the codeword. This can be bounded to a specific length at design, compile, configuration or run time, as mentioned previously in the background section of this document. A length of 0 also indicates that the data value is uncompressed. In the example embodiment of the compressed block of FIG. 21, the first compressed data value in the variable-length bit sequence has a length of 1 (the respective codeword is '0'), the second compressed data value in the variable-length bit sequence has a length of 2 (the respective codeword is "11"), and so on. This way the value retrieval of multiple compressed data values can be parallelized by simplifying the decompressor but at the cost of increasing the size of the compressed data block, thus possibly reducing the compression efficiency.

Figure 23:
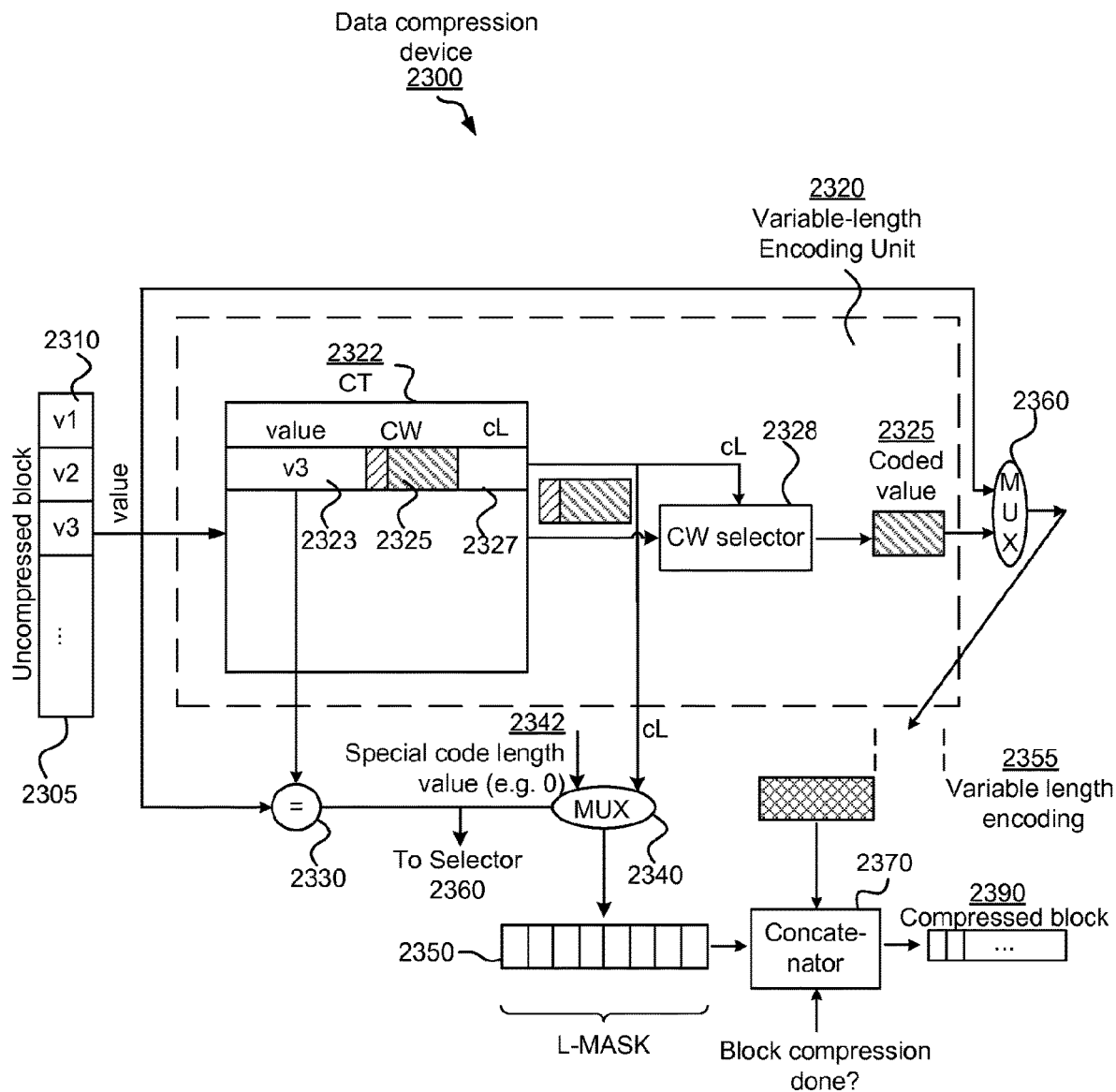
FIG. 23 illustrates a data compression device, based on the compressor of FIG. 9 but modified and extended to be able to compress the uncompressed data block of FIG. 21.

A block diagram of an example data compression device 2300 that is able to form the compressed data block of FIG. 21 is depicted in FIG. 23. The data compression device 2300 comprises a compressor in the form of a Variable-length Encoding Unit 2320, a register 2350 for storing the L-MASK ('l' stands for code-length), and logic 2340, 2360, 2370 which form a compressed data block generator. Contrary to the device of FIG. 9, the unit 2320 outputs not only the coded data value 1625 but also the cL (code length) that is recorded in the L-MASK. The amount of entries comprised in the L-MASK is decided at design, compile, configuration or run time (depending on the implementation) based on the block size and its number of data values. For example, if a data block in uncompressed form comprises 8 data values (i.e., n=8), the L-MASK register 2350 comprises 8 entries. The entry width is determined by the maximum codeword length, which can be bounded as described in the previous paragraph, thus it is log 2(max_cw_length). For each value under compression, (not shown in FIG. 23 but one skilled in the art can implement a counter to monitor which value is under compression), the cL stored in the respective position of the L-MASK register 2350. When all the values of the data block have been compressed, the L-MASK is concatenated prior the variable-length encoding 2355 forming the compressed block 2390 using a concatenator unit 2370. Hence, the length mask L-MASK precedes the variable-length codewords 2325 in the compressed data block 2390 of the disclosed embodiment; the opposite order is however also possible in other embodiments.

Furthermore, a comparator 2330 and selectors 2340 and 2360 are needed if the Variable-length encoding unit 2320 cannot compress all the possible data values so that it can determine whether a data value will remain uncompressed and record its size as 0 in the L-MASK. Thus, in an alternative embodiment where all the values are compressed, this logic can be omitted, thus connecting the cL to the L-Mask register 2350.

Hence, the data compression device 2300 in FIG. 23 further comprises a detector in the form of the comparator 2330 coupled to the compressor 2320 and configured to detect data values of the uncompressed data block 2310 that cannot be compressed by the compressor 2320. The compressed data block generator 2340-2370 is configured to store, at a respective position in the length mask L-MASK, a code length cL having a special value when the detector (comparator) 2330 has detected that a data value of the uncompressed data block 2310 cannot be compressed, and store this data value uncompressed in the compressed data block 2390. In the disclosed embodiment, the special value of the code length is 0.

Moreover, in the data compression device 2300 in FIG. 23, the detector 2330 is configured to detect data values of the uncompressed data block 2310 that cannot be compressed by the compressor 2320 as one or more of the following:

data values which do not exist in a code table 2322 of the compressor 2320, data values which exist in the code table but lack codewords 2325 in the code table of the compressor, data values which exist in the code table, have codewords 2325 therein but are indicated as invalid in the code table of the compressor.

Also, in the data compression device 2300 in FIG. 23, the compressed data block generator 2340-2370 is configured to generate the compressed data block 2390 by including compressed data values in the form of the variable-length codewords 2325 as provided by the compressor 2320 and uncompressed data values as detected by the detector 2330 in the order of the data values v1-v$n$ of the uncompressed data block 2310.

In an alternative embodiment of the data compression device 2300, where some data values remain uncompressed, it can be selected to not mix the uncompressed data value(s) with the codewords of the compressed data values together. Instead, all the uncompressed data values are saved in a different buffer that in the end is placed in reverse order and is attached in the end of the compressed data block 2390 by the concatenator 2370. Although the ordering of compressed and uncompressed data values in the compressed data block is disturbed in comparison to the uncompressed data block, the original ordering is maintained in the L-MASK. An example embodiment of such a compressed data block where the uncompressed data values are stored in the end of it is illustrated in FIG. 22. The uncompressed data value "500" appears in the $6^{th}$ position of the uncompressed data block. This is recorded by placing the 0 code-length in the $6^{th}$ position of the L-MASK and placing the uncompressed data value "500" in the end of the compressed data block. Example embodiments of said alternative data compression device can be realized by one skilled in the art.

Accordingly, in the alternative embodiment of the data compression device 2300, the compressed data block generator 2340-2370 is configured to generate the compressed data block 2390 by including first the compressed data values in the form of the variable-length codewords 2325 as provided by the compressor 2320 in the order of the data values v1-vn of the uncompressed data block 2310, and then the uncompressed data values as detected by the detector 2330, or vice versa. Advantageously, the uncompressed data values are stored in reversed order in the generated compressed data block 2390 compared to their order in the uncompressed data block 2310. Since the order of all respective code lengths cL in the length mask L-MASK follows the order of all data values v1-vn of the uncompressed data block 2310, reconstruction of all data values in the original order of the uncompressed data block 2310 will nevertheless be allowed during decompression of the compressed data block 2390.

The disclosure of FIG. 23 above can alternatively be seen as a device that compresses an uncompressed data block that comprises one or plurality of data values into a compressed block (i.e., a data compression device); where said compressed data block comprises a bit mask and a variable length bit sequence which further comprises one or a plurality of compressed data values encoded with variable-length encoding; where said device comprises: a compressor for compressing data values with variable-length codings that correspond to said data values; a mechanism to record the coding lengths of one or a plurality of compressed data values encoded with variable-length encoding in said bit mask.

Figure 24:
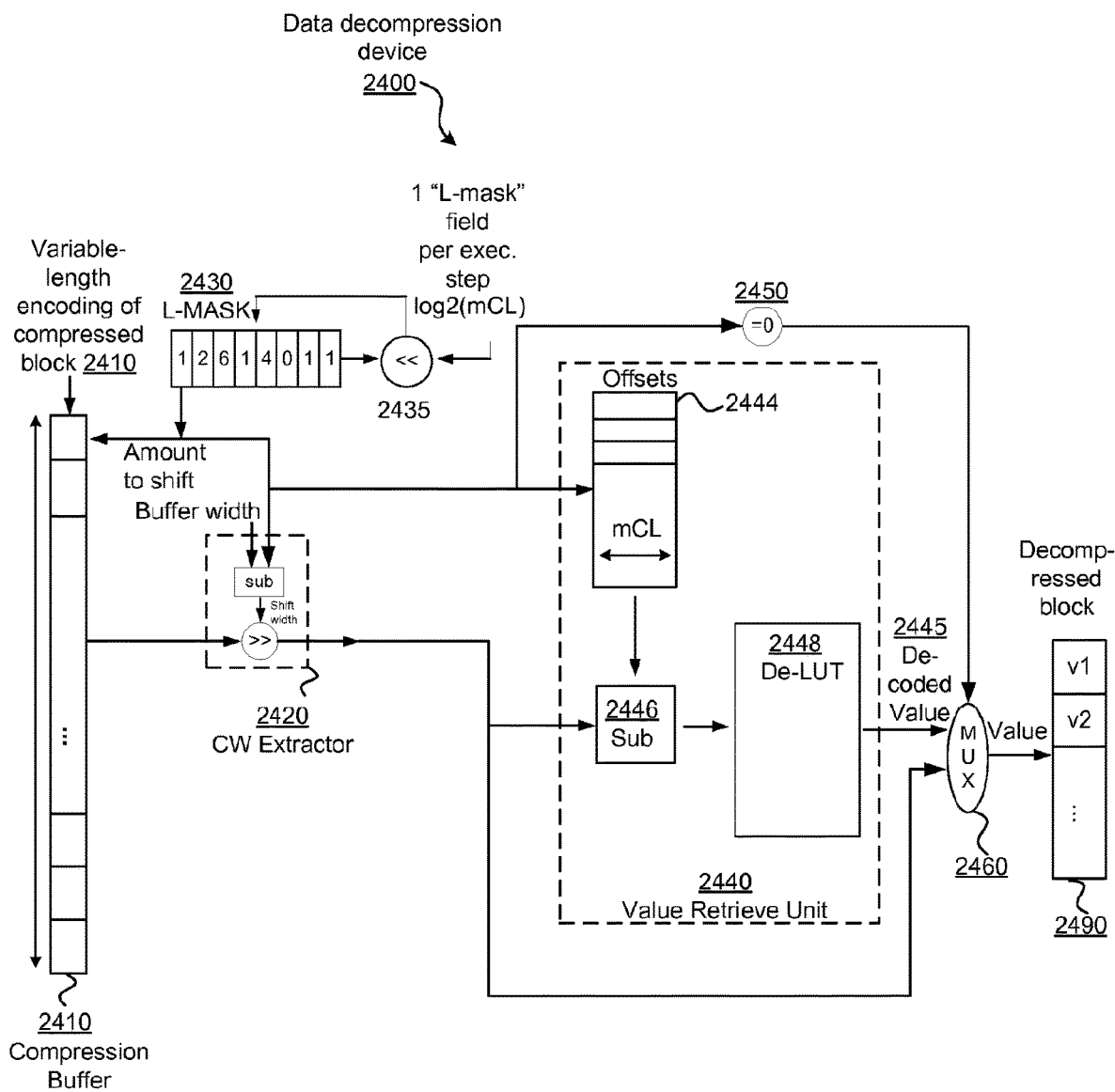
FIG. 24 illustrates a data decompression device, based on the decompressor of FIG. 10 but modified and extended to be able to decompress the compressed data block of FIG. 21.

A block diagram of an example data decompression device 2400 that is able to decompress said compressed data block of FIG. 21 is depicted in FIG. 24. The data decompression device 2400 comprises a storage unit that is referred to as Compression Buffer 2405, which saves part of the compressed data block 2410 (the size of said storage unit 2405 is at least the maximum of the uncompressed value length and the maximum codeword length), a Codeword Extractor 2420, an L-MASK storage unit 2430, a Value Retrieve Unit 2440 (similar to the Value Retrieve Unit 1030 of the decompressor 1000 of FIG. 10), and extra logic 2450-2470 which forms a decompressed data block generator 2450-2470. The L-MASK storage unit 2430 saves the first N bits of the compressed data block 2410 and is fully compatible with the L-MASK of the data compression device 2300. For example, for a data block of 8 data values and a maximum codeword length of 15 bits, N is 4*8=32 bits, while the L-MASK storage unit 2430 comprises 8 entries. The decompressed data block generator 2450-2470 comprises a comparator 2450, which checks whether the compressed data value under decompression is indeed compressed or uncompressed (thus no decompression is needed), a selector 2460 that selects between a decoded data value 2445 and an uncompressed data value based on the outcome of the comparator 2450, and a decompressed data block storage 2470 that keeps the formed decompressed data block 2490 of data values v1 . . . n.

Block decompression is divided in execution steps. In the beginning of each execution step, an L-MASK entry, which indicates the length of a specific codeword, is used to discard the codeword that will be decompressed in this execution step, thus should not be part of the bit subsequence stored in the Compression Buffer 2405 in the next execution step. Said discard amount is referred to as "amount to shift" in FIG. 14. If the length of a specific L-MASK entry is 0, then the shifting amount is the size of the uncompressed value (also is decided at design, compile, configuration or run time depending on the implementation), e.g., 32 bits. In the same execution step, the CW (codeword) Extractor 2420 takes as input the compressed sequence stored in the Compression Buffer 2405 and the codeword length provided by the L-MASK storage unit 2430 and extracts the codeword out of the compressed sequence. In this embodiment, the Codeword Extractor 2420 comprises a subtractor, which subtracts from the buffer-width the codeword-length value, and a shifter that right-shifts the input to unit 2420 by the amount calculated by the subtractor. The shifter right-shifts, if the leftmost part of the buffer contains the beginning of the compressed sequence. Then the extracted codeword is supplied to the Value Retrieve Unit 2440 which uses the codeword to determine the associated uncompressed data value. The codeword length of the L-MASK storage unit 2430 is also used to locate the appropriate offset among the Offsets 2444 in the Value Retrieve Unit 2440.

For example, the variable-length encoding of the compressed data block 01111110101110 . . . , as depicted in FIG. 21, comprises the codewords 0, 11, 111101, etc, as indicated by the L-mask "1,2,6,1,4 . . . " saved in the beginning of said compressed data block. Therefore in order to retrieve the data value that is associated with codeword 0, we need first to discard the bit sequence 1111110101110 . . . (this is executed by the CW Extractor 2420). In the same step, we also need to discard the codeword 0 from the Compression Buffer 2405, in order to be able to retrieve the second data value that is associated with the second codeword 11 in the second execution step.

Figure 10:
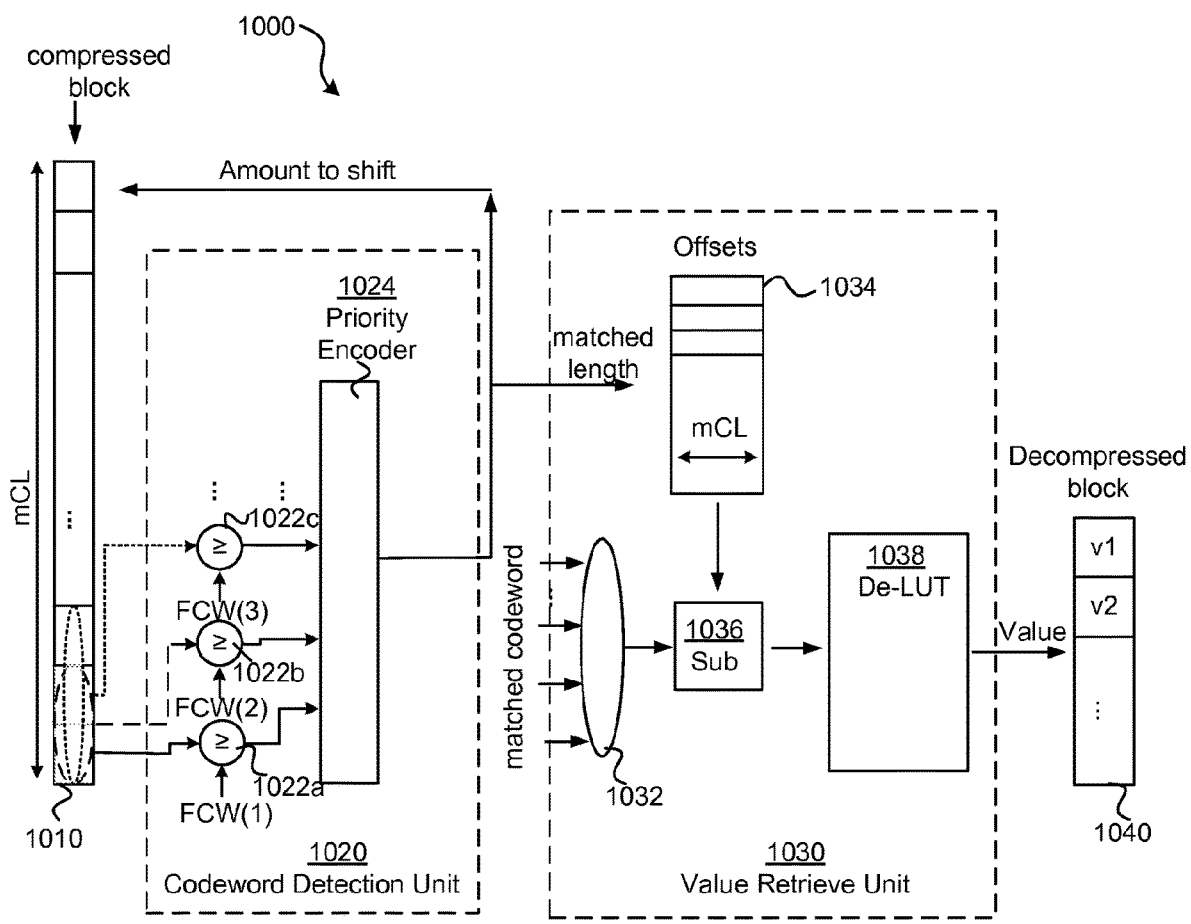
FIG. 10 illustrates a decompressor that is used to decode (or decompress) blocks that were compressed using canonical Huffman encoding.

By comparing the example data decompression device 2400 of FIG. 24 to the decompression device 1000 of FIG. 10, the former can be faster than the latter, as the logic depth of the Codeword Detection Unit 1020 (of the decompression device 1020) which comprises comparators, a priority encoder, and shifting is larger than the CW Extractor 2420 (of the data decompression device 2400) that comprises an arithmetic and a shift operation.

As is clear from the above, in the data decompression device 2400 in FIG. 24, the decompressed data block generator 2450-2470 is configured to:
    detect, for one or more positions in the length mask L-MASK, one or more code lengths having a special value indicating that one or more corresponding data values is/are included in uncompressed form in the compressed data block 2410; and based on the detected one or more code lengths having the special value, generate the decompressed data block 2490 by combining decompressed data values from the decompressor 2440 and the one or more corresponding data values in uncompressed form from the compressed data block 2410. Again, the special value of code lengths may advantageously be 0.

Figure 25:
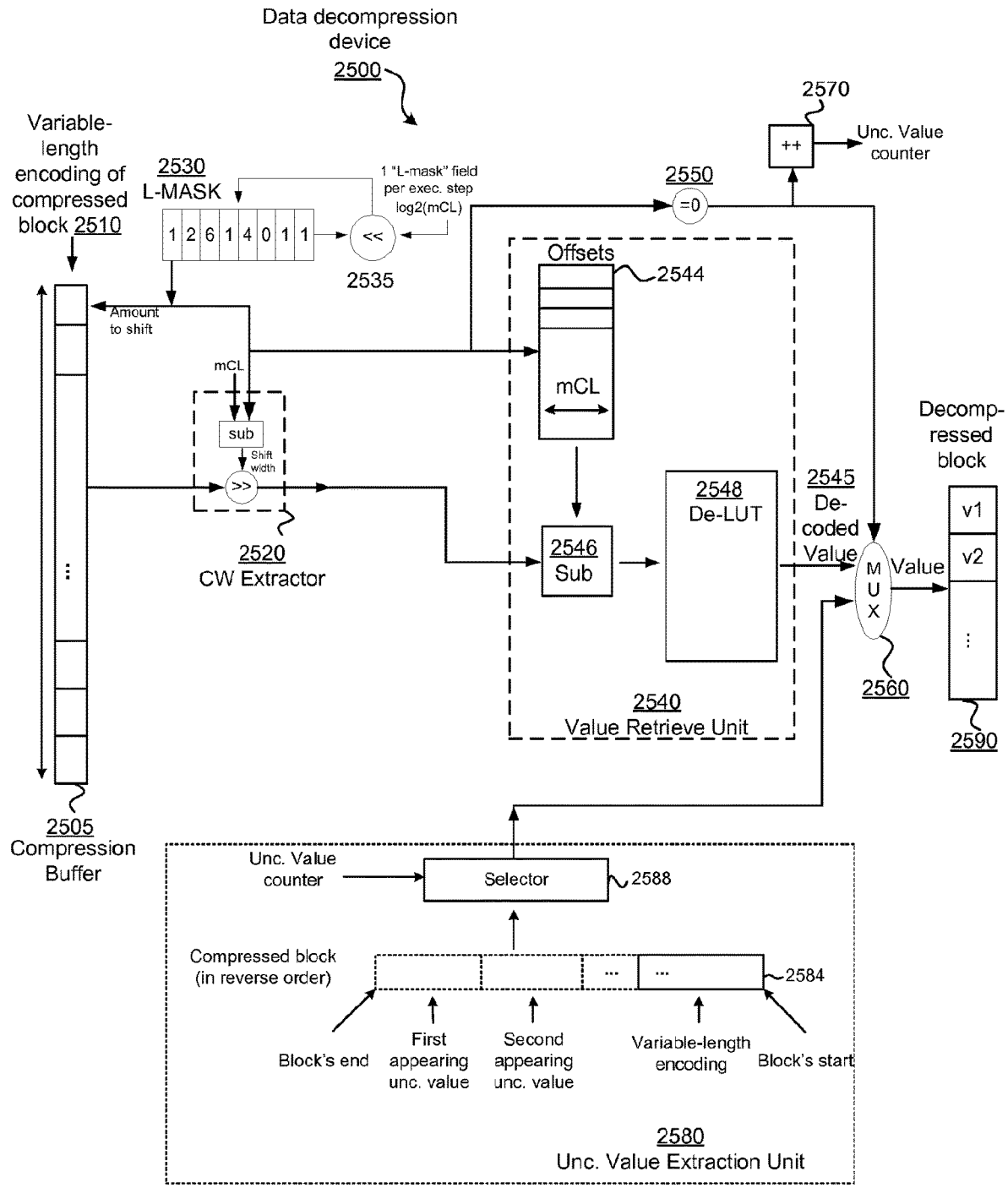
FIG. 25 illustrates a data decompression device, based on the decompressor of FIG. 10 but modified and extended to be able to decompress the compressed data block of FIG. 22.

As was explained above for the data compression device 2300, uncompressed data values do not need to be mixed with the compressed data values in the variable-length encoding 2355 at the compressor side. An alternative embodiment of the data decompression device 2400 that can decompress a data block which has been compressed in this way is illustrated in FIG. 25. Contrary to the data decompression device 2400, the data decompression device 2500 comprises also the Unc. Value Extraction Unit 2580. The difference between the devices 2400 and 2500 is that the former will extract the uncompressed value from the Compression Buffer 2405 while the latter from a storage unit 2584 that contains the compressed data block 2510 in reverse order (i.e., first uncompressed data value, second uncompressed data value, ..., last uncompressed data value, variable length encoding in reverse order). When an L-MASK entry contains the length 0, a counter that keeps the number of uncompressed data values is incremented and the respective uncompressed data value is read from the storage unit 2584 using a selector 2588. In this data decompression device 2500, the "amount to shift" the content of the Compression Buffer 2505 is 0 when the L-MASK entry is 0, contrary to the device 2400 where the "amount to shift" equals the width of the uncompressed data value. Due to this, the Compression Buffer 2505 can be of narrower depth (i.e., equal to the maximum codeword length), minimizing the logic depth of the disclosed data decompression device even more.

Figure 26:
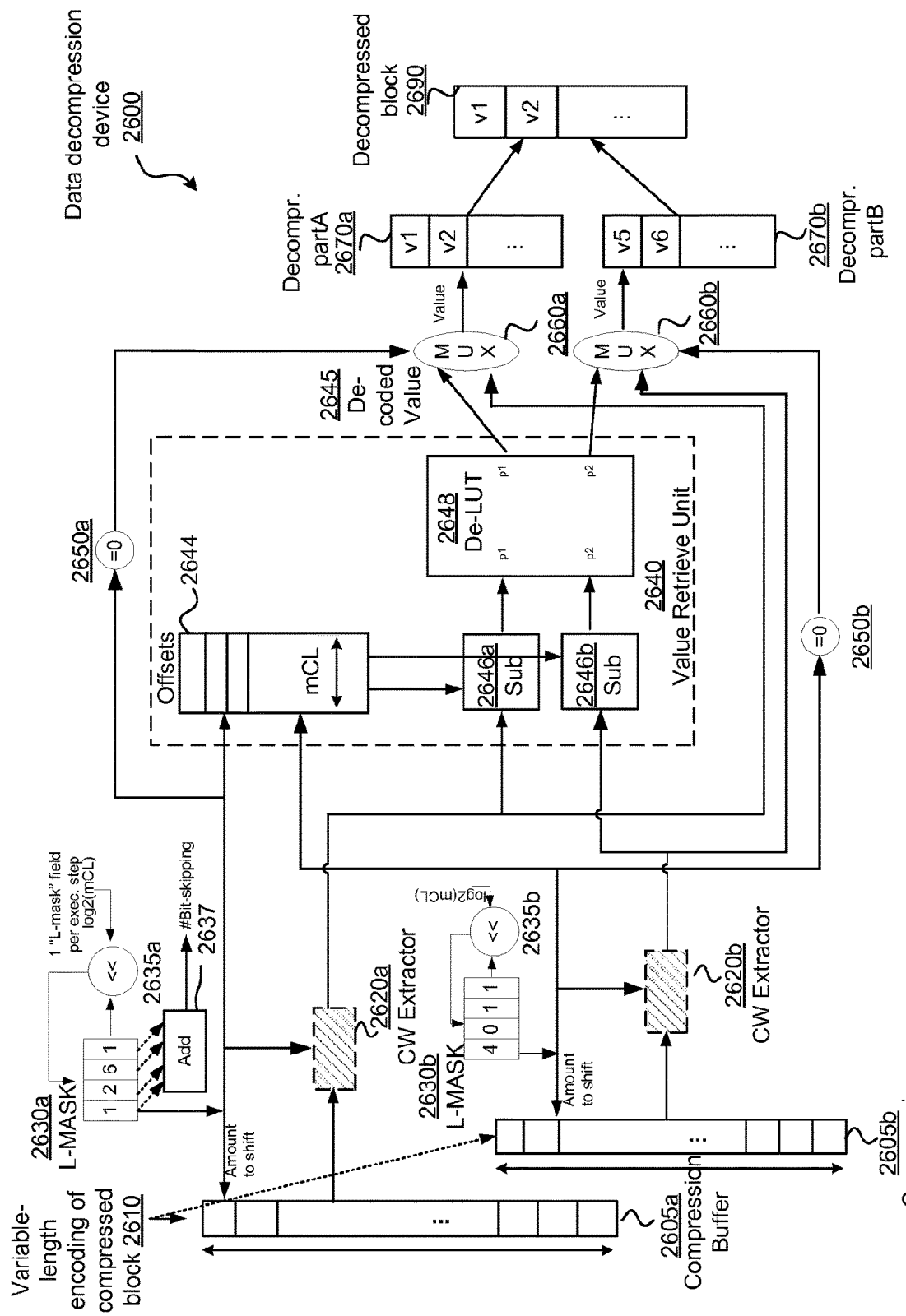
FIG. 26 illustrates a data decompression device, based on the decompression device of FIG. 24 but modified and extended to be able to decompress 2 compressed values in parallel.
Figure 27:
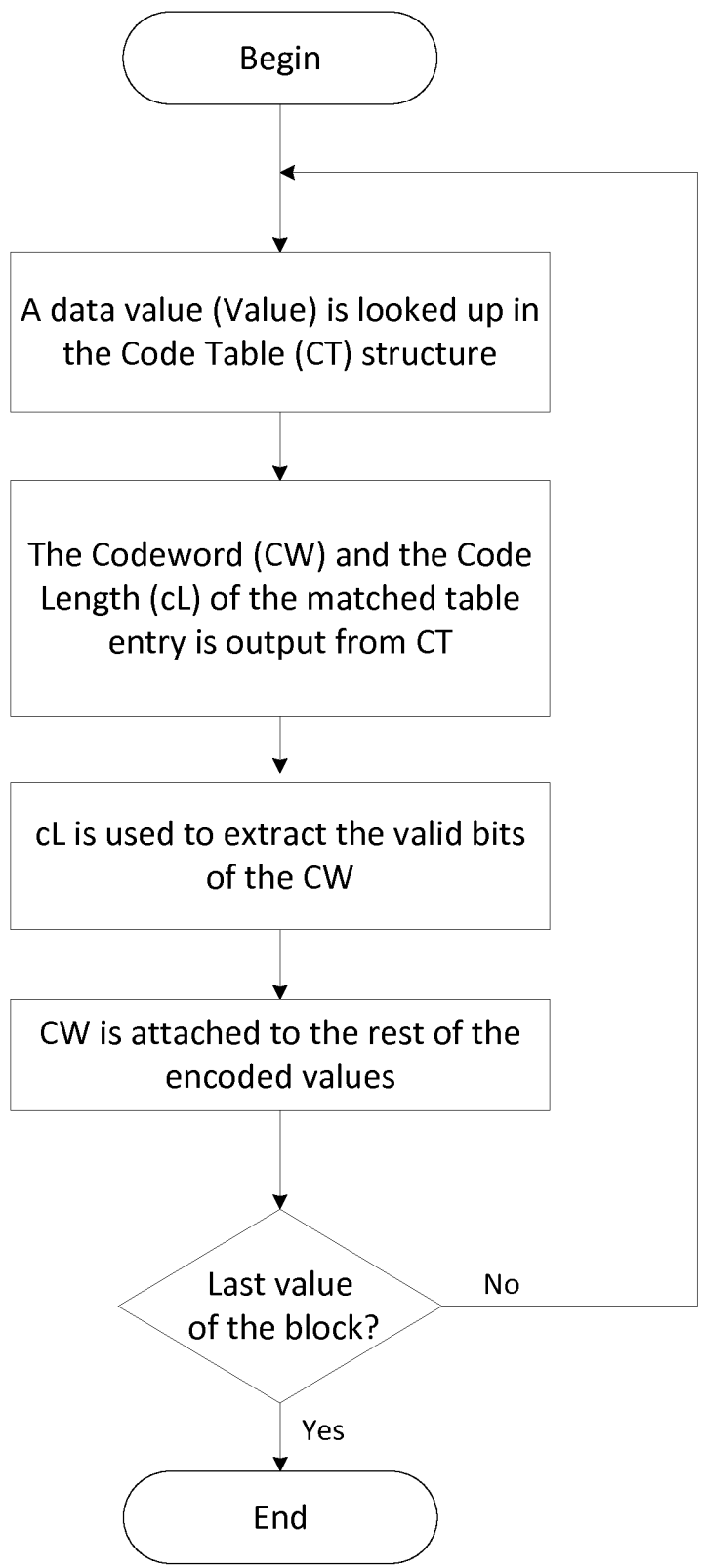
FIG. 27 illustrates an exemplary flow chart of a compression method for compressing an uncompressed data block using variable-length encoding (e.g., Huffman).
Figure 28:
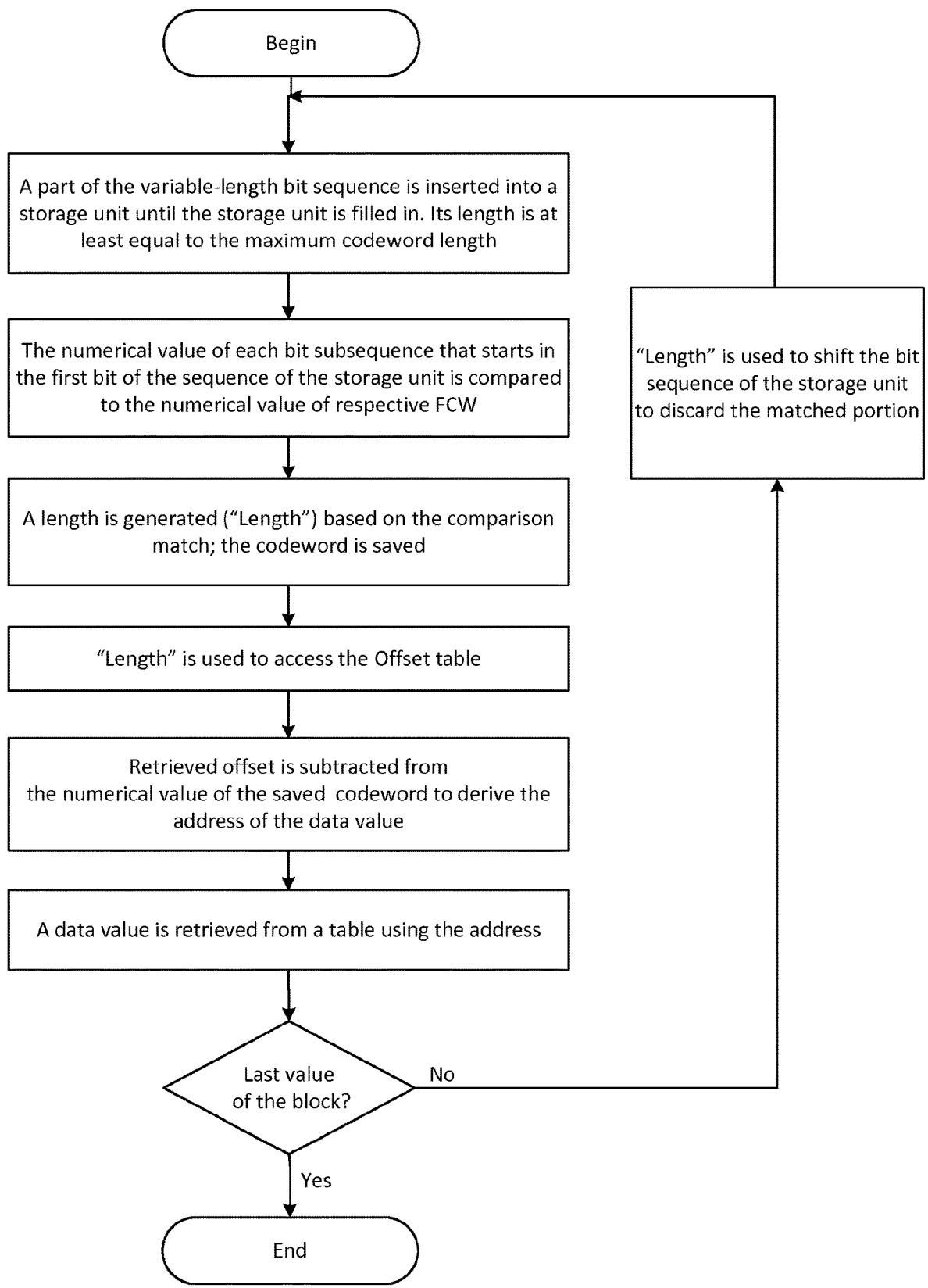
FIG. 28 illustrates an exemplary flow chart of a decompression method for decompressing a compressed data block that is compressed using variable-length encoding (e.g., canonical Huffman).
Figure 29A:
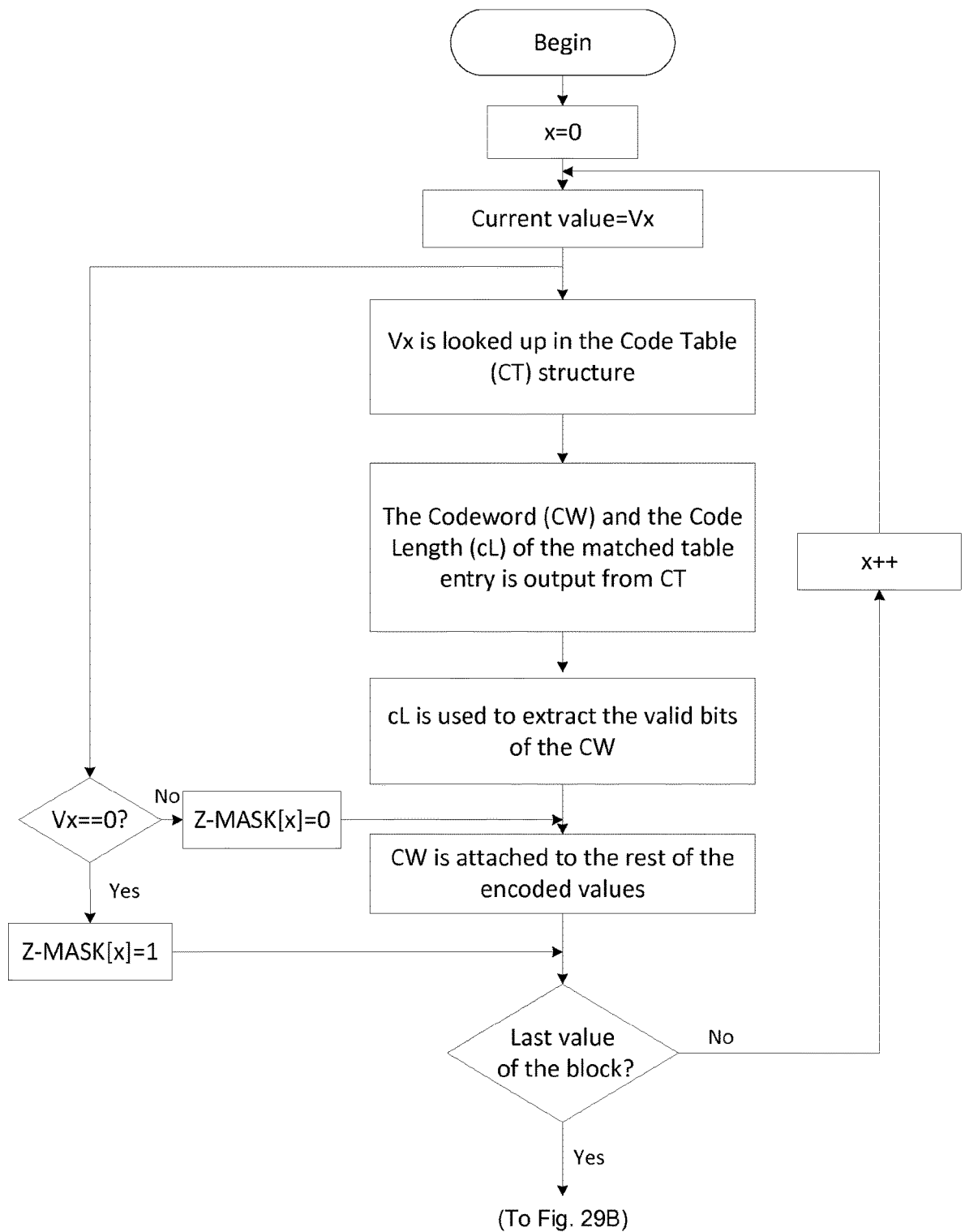
FIG. 29 illustrates an exemplary flow chart of a new method that is built on the top of the compression method of FIG. 27 and follows similar steps to the compression device of FIG. 18 so that it is able to compress the uncompressed data blocks of FIGS. 14 and 15.
Figure 29B:
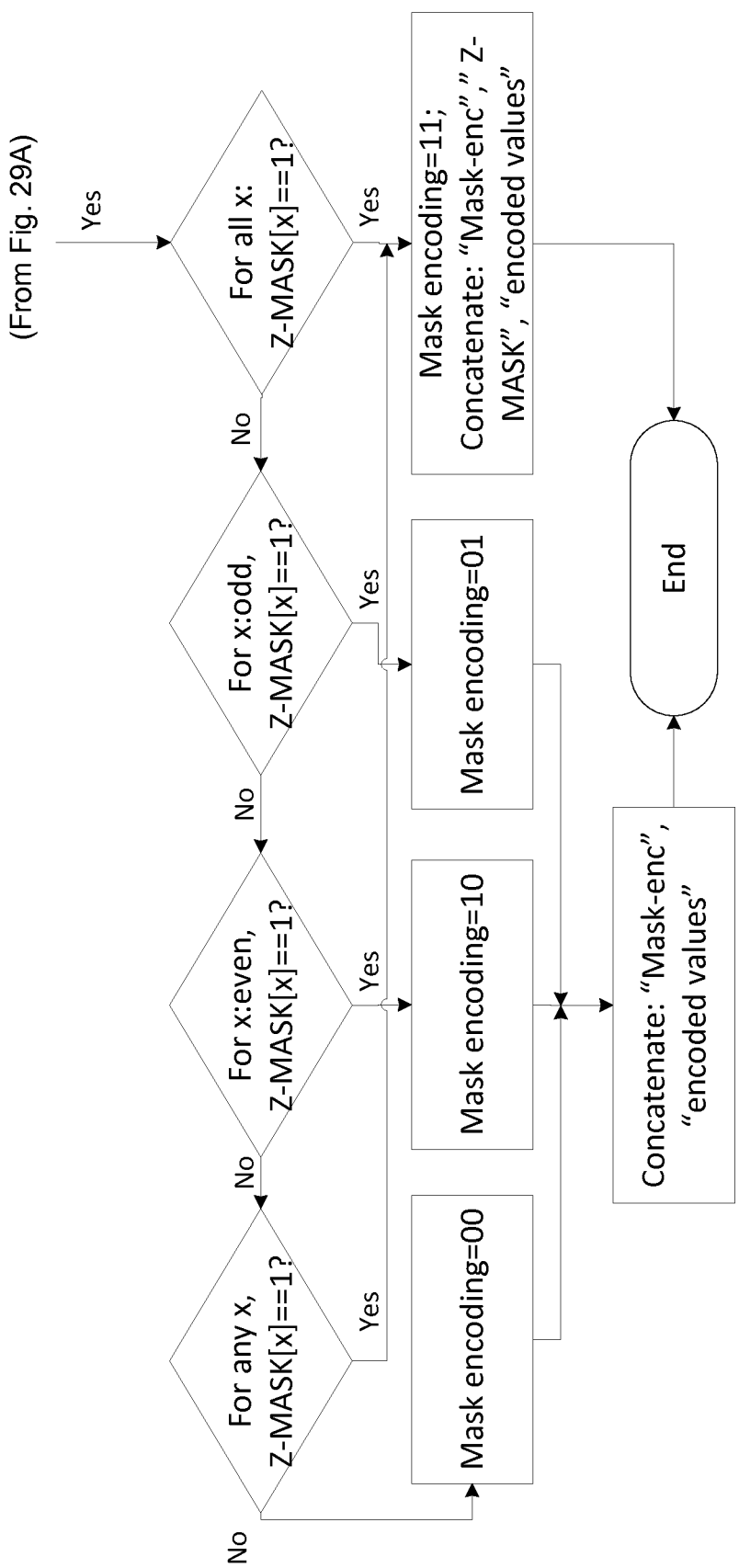
Figure 30A:
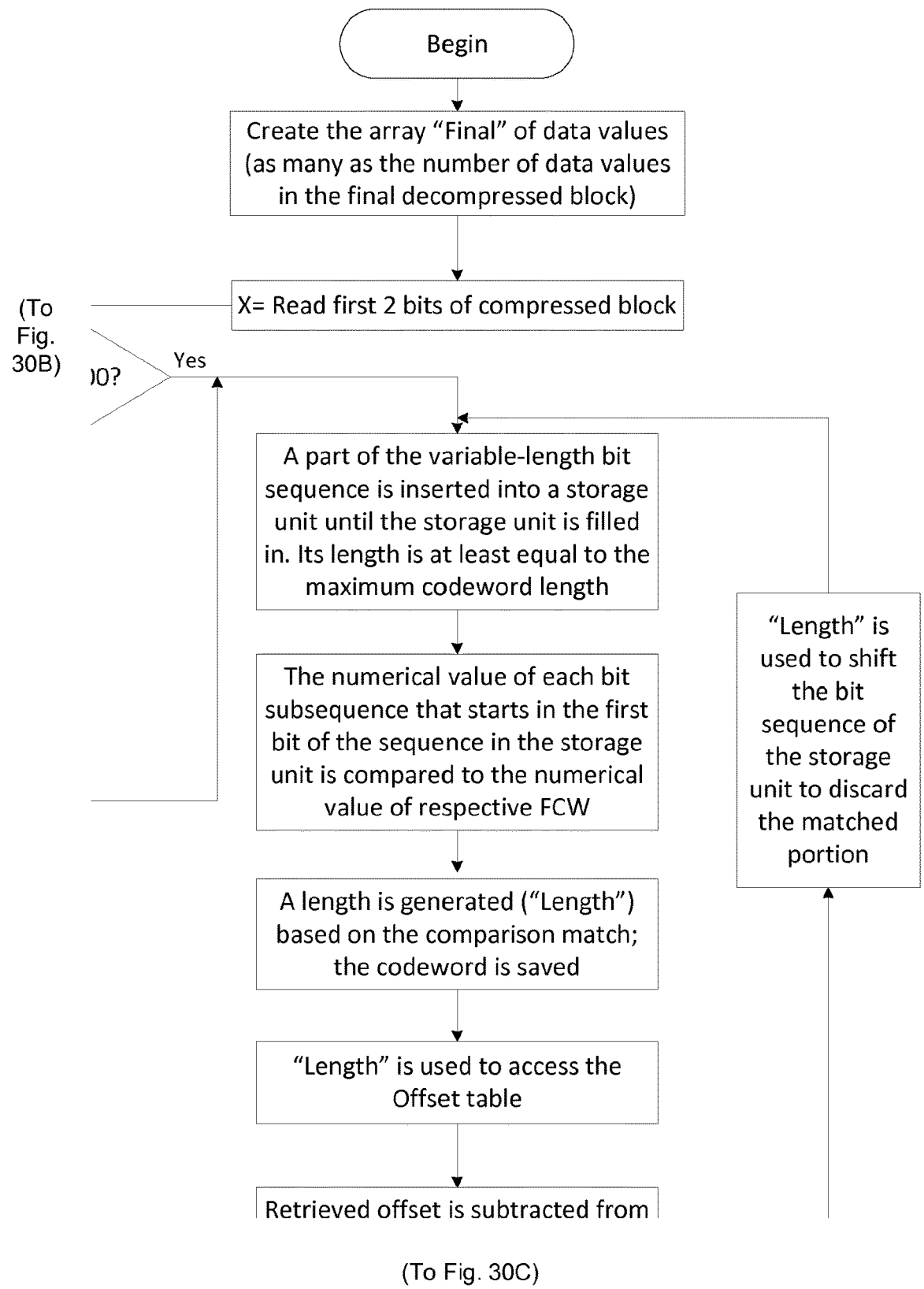
FIG. 30 illustrates an exemplary flow chart of a new method that is built on the top of the method of FIG. 28 and follows similar steps to the decompression device of FIG. 19 so that it is able to decompress the compressed data block of FIGS. 14 and 15.
Figure 30B:
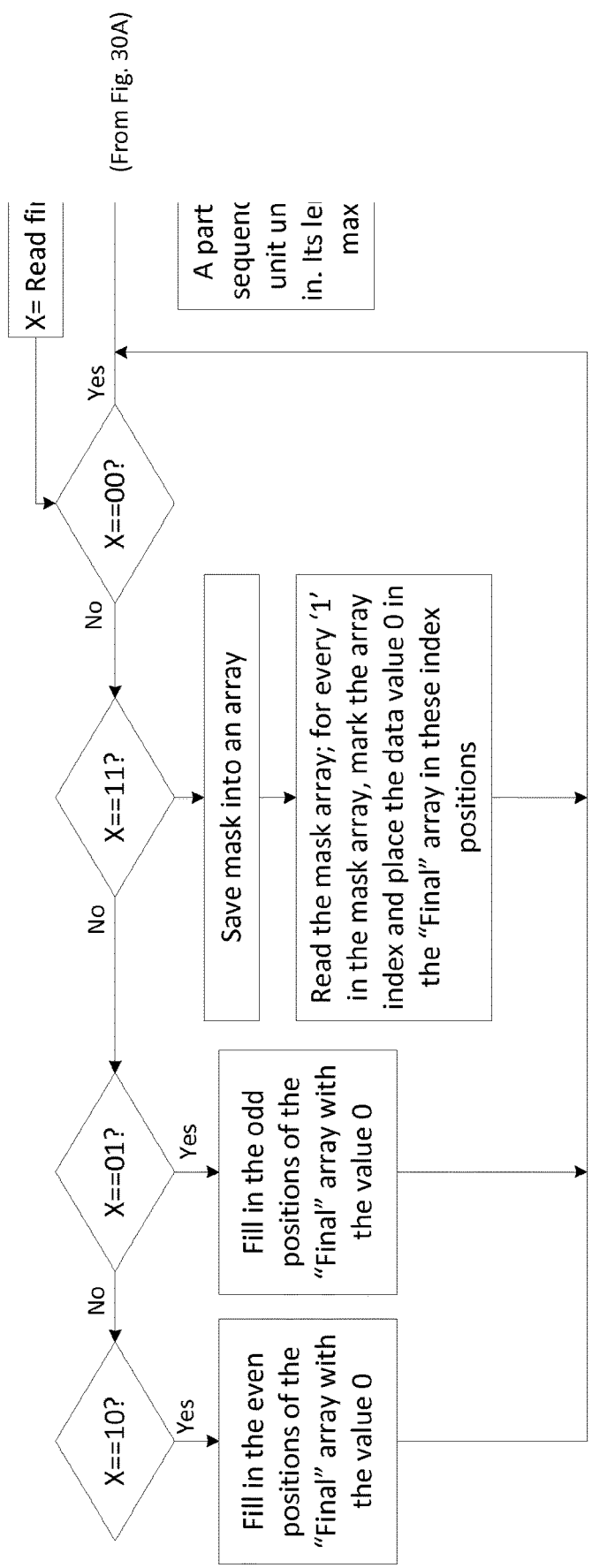
Figure 30C:
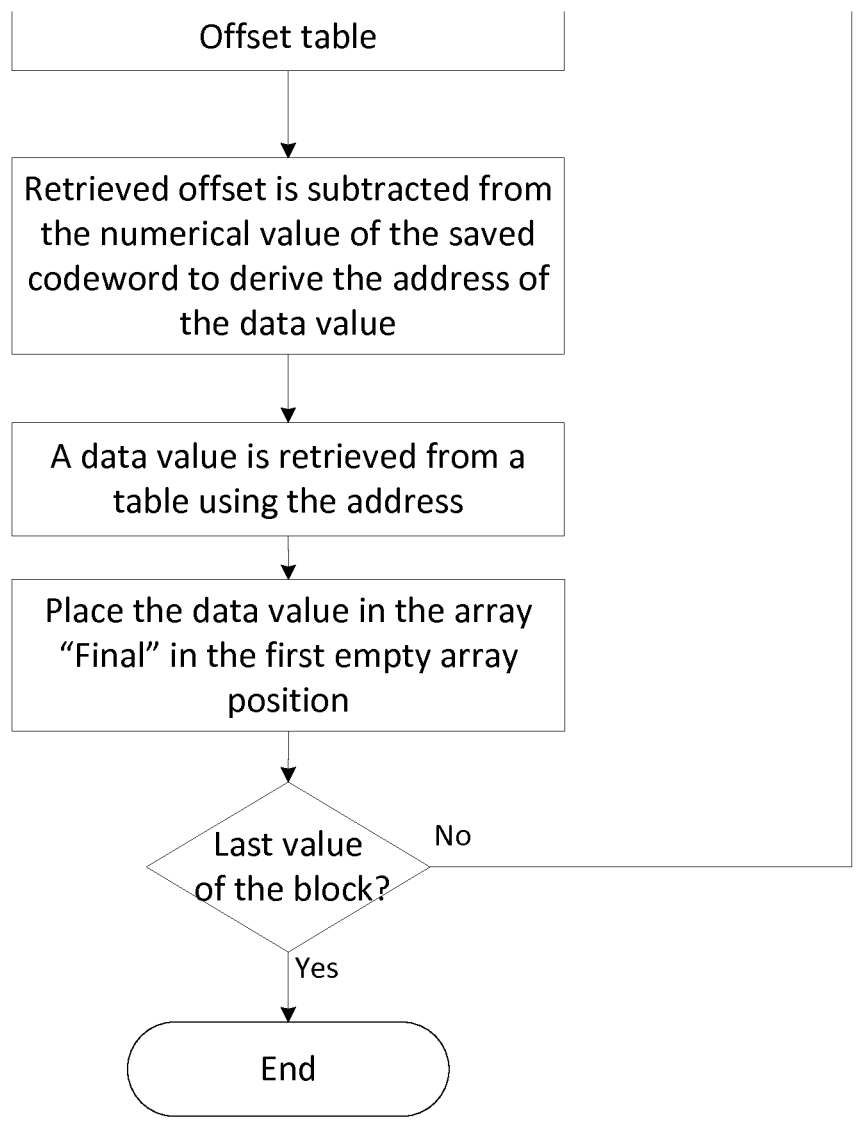
Figure 31:
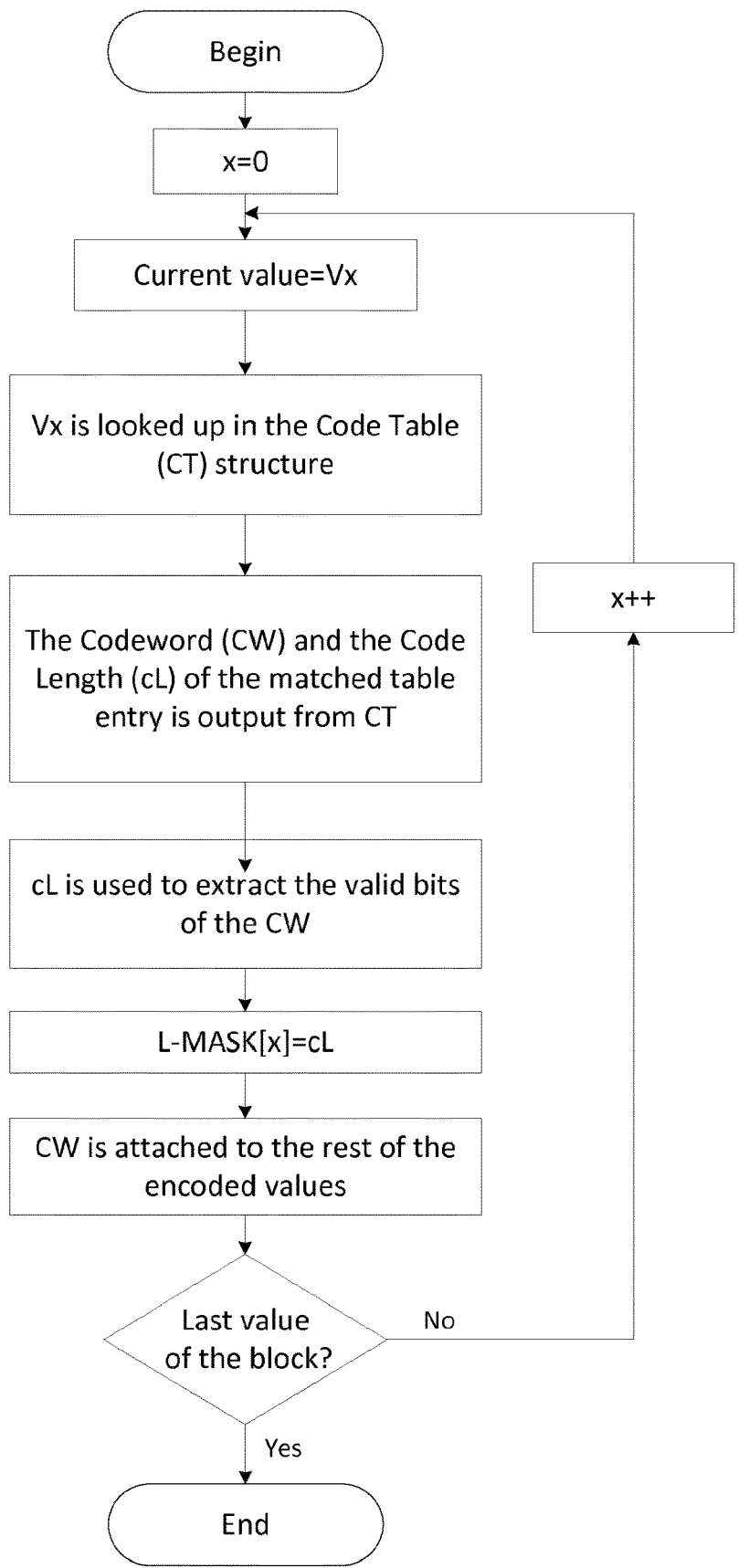
FIG. 31 illustrates an exemplary flow chart of a new method that is built on the top of the compression method of FIG. 27 and follows similar steps to the compression device of FIG. 23 (skipping the steps needed to determine uncompressed values and mix compressed and uncompressed values) so that it is able to compress the uncompressed data block of FIG. 21.
Figure 32:
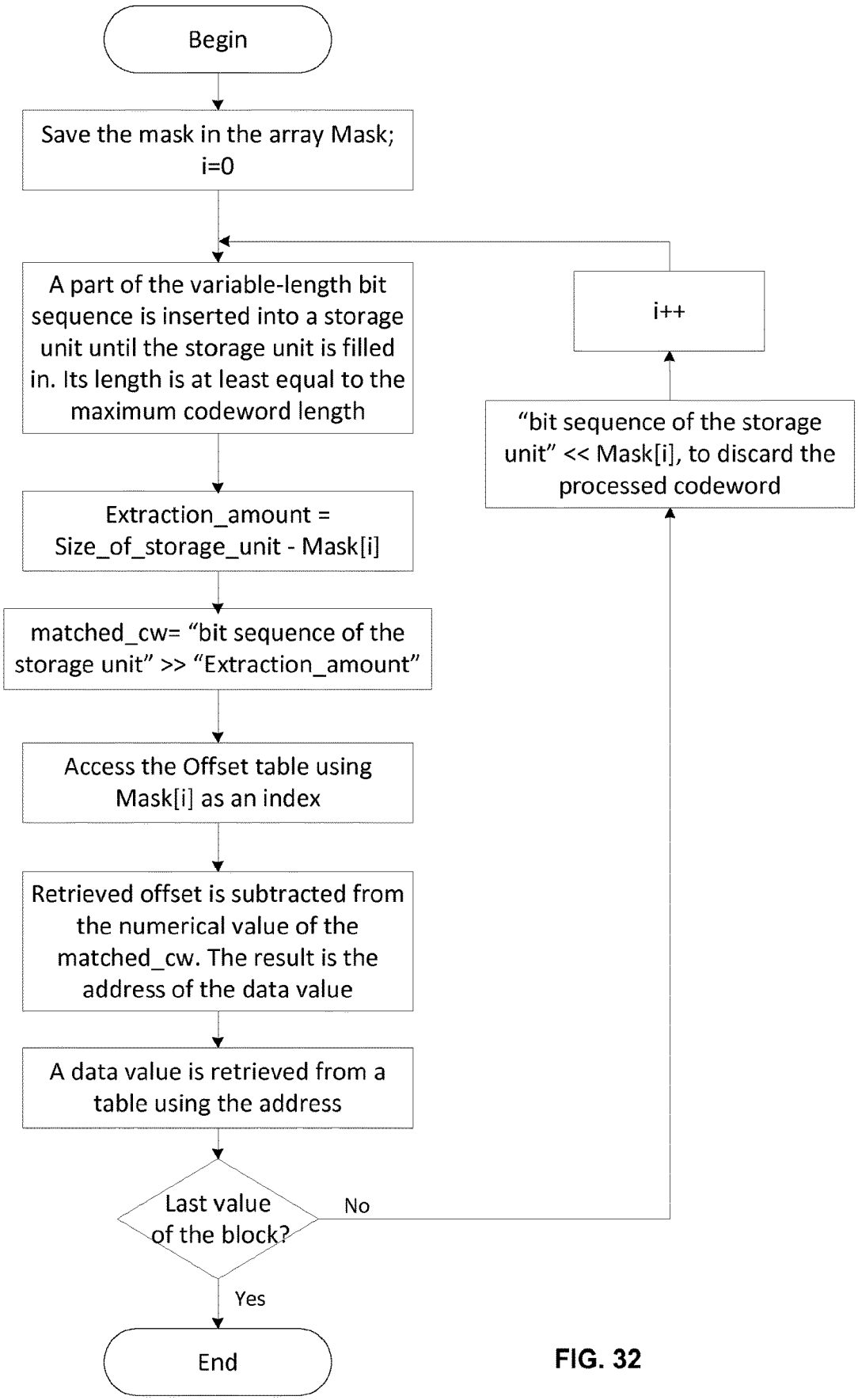
FIG. 32 illustrates an exemplary flow chart of a new method that is built on the top of the decompression method of FIG. 28 and follows similar steps to the decompression device of FIG. 24 (skipping the steps needed to determine uncompressed values and mix compressed and uncompressed values) so that it is able to decompress the compressed data block of FIG. 21.

The aforementioned data decompression devices 2400 and 2500 have improved performance in comparison to the decompression device 1000, however, a compressed data block is still decompressed sequentially. An alternative embodiment of the data decompression device 2400 that can decompress 2 values in the same execution step is illustrated in FIG. 26, wherein the data decompression device 2600 decompresses in parallel from two streams of the same compressed data block (for each execution step). This is done by almost duplicating the units of 2400 except for: 1) the Value Retrieve Unit 2640 that is one (offsets 2644 and DeLUT 2648 are mapped to 2-port memories); and 2) the L-MASK has been divided in two pieces, 2630*a* and 2630*b*: 2630*a* contains the first half of the L-MASK, while 2630*b* contains the second half of it. The units are now denoted as "a" and "b", for example, CW Extractor 2620*a* and CW Extractor 2620*b*, while the data decompression device 2600 comprises in essence two decompressors: one that comprises all "a" units and another that comprises all "b" units. There is also an extra unit, the adder 2690. In an alternative embodiment, the Value Retrieve units could have been duplicated instead.

In the data decompression device 2600, decompression works as follows: half of the L-MASK is placed in the storage unit 2630*a* and the other half in 2630*b*. Then the length values of the first half of L-MASK are added (2690) to calculate the location of the beginning of the second part (measured in number of bits skipped from the beginning of the variable-length encoding of the compressed data block) inside the compressed data block that will be decompressed by the decompressor "b". Each of the two decompressors keeps the decompressed value sub-blocks in 2670*a* and 2670*b* which are concatenated when all the compressed data values are decompressed.

In an alternative embodiment where 2 values are decompressed in the same execution step, the L-MASK can be maintained one and the adder 2690 is not needed if instead the 2 values decompressed in the same execution step are consecutive. In such example embodiment, an extra shifter is needed prior the CW extractor "b" to discard the codeword that will be extracted by the CW extractor "a".

The extra area/logic that is added due to parallelization in said data decompression devices if implemented in hardware is minor in comparison to the extra logic needed for parallelizing the decompression device 1000, because the Codeword Detection unit 1020 has a more complex design than the respective Codeword Extractor 2620.

In an alternative embodiment where a plurality of compressed data values are decompressed in parallel, the decompressor design needs to be accordingly modified by someone skilled in the art.

The disclosures of FIGS. 24-26 above can alternatively be seen as a device that decompresses a compressed data block into one or plurality of data values (i.e., a data decompression device); where said compressed data block comprises a bit mask and a variable length bit sequence which further comprises one or a plurality of compressed data values encoded with variable-length encoding and one or a plurality of coding length values encoded in the bitmask; where said device comprises: a decompressor for decompressing variable-length codings to reconstruct data values that correspond to said variable-length codings; a first mechanism to read a bit mask to determine the lengths of codings within the variable-length bit sequence and a second mechanism that uses indications from first mechanism to extract codings from variable-length bit sequence and supply to decompressor and third mechanism that forms decompressed block In the aforementioned embodiments of a data compression device and/or a data decompression device, delay units such as flip flops can be inserted, by those skilled in the art, so that compression of one block's data value or/and decompression of one compressed block's value can be pipelined into a plurality of stages to reduce the clock cycle time and increase the processing (compression or/and decompression) throughput.

Furthermore, alternative embodiments of the data compression devices and/or data decompression devices disclosed in this disclosure can be parallelized, by those skilled in the art and according to teachings which are commonly known per se, by compressing a plurality of block's data values or/and decompressing a plurality of compressed block's data values at the same time. In such a case, the decompressor design needs to be accordingly modified by someone skilled in the art.

The respective data compression devices 1600, 1800, 2300 in FIGS. 16, 18 and 23 may for instance be implemented in hardware, e.g. as digital circuitry in an integrated circuit, as a dedicated device (e.g. a memory controller), as a programmable processing device (e.g. a central processing unit (CPU) or digital signal processor (DSP), as a field-programmable gate array (FPGA), etc. The functionality of the respective data compression methods described in this disclosure may for instance be performed by the respective data compression devices 1600, 1800, 2300 being appropriately configured, or as respective computer program products comprising code instructions which, when loaded and executed by a general-purpose processing device such as a CPU or DSP, cause performance of the respective methods.

The respective data decompression devices 1700, 1900, 2400, 2500, 2600 in FIGS. 17, 19, 24, 25 and 26 may for instance be implemented in hardware, e.g. as digital circuitry in an integrated circuit, as a dedicated device (e.g. a memory controller), as a programmable processing device (e.g. a central processing unit (CPU) or digital signal processor (DSP), as a field-programmable gate array (FPGA), etc. The functionality of the respective data decompression methods described in this disclosure may for instance be performed by the respective data decompression devices 1700, 1900, 2400, 2500, 2600 being appropriately configured, or as respective computer program products comprising code instructions which, when loaded and executed by a general-purpose processing device such as a CPU or DSP (for instance any of the processing units P1 . . . Pn of FIGS. 1-5), cause performance of the respective methods.

The example embodiments disclosed herein present methods, devices and systems for data block compression and decompression in or for a cache/memory subsystem, in or for a data transferring subsystem in a computer system, or in or for a communication network, in order to store or transfer information more compactly.

Figure 33:
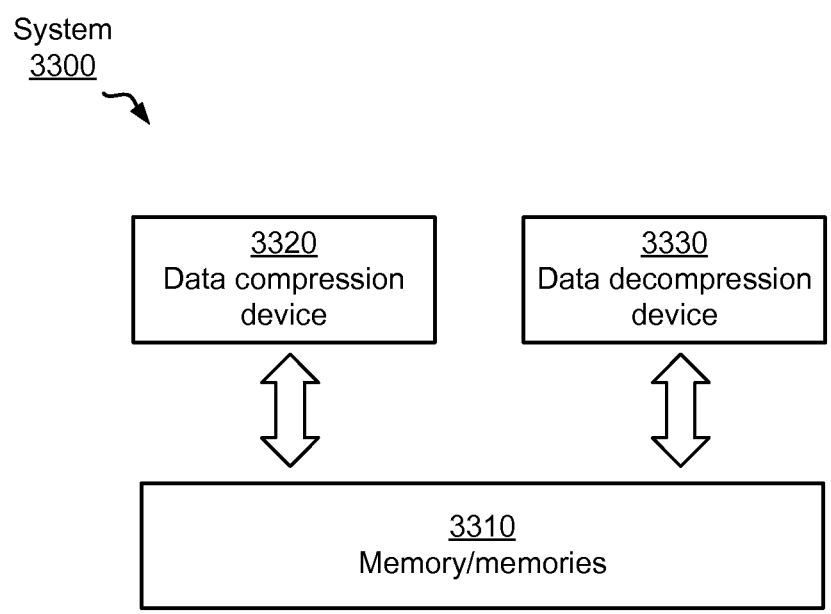
FIG. 33 illustrates a general system according to the invention.

FIG. 33 illustrates a general system 3300 according to the invention. The system comprises one or more memories 3310, a data compression device 3320 (such as, for instance, any of the data compression devices 1600, 1800, 2300) and a data decompression device 3330 (such as, for instance, any of the data decompression devices 1700, 1900, 2400, 2500, 2600). Advantageously, the system 3300 is a computer system (such as any of the computer systems 100-500 of FIGS. 1-5), and said one or more memories 3310 is/are cache memory/memories (such as any of the cache memories L1-L3 of FIGS. 1-5), random access memory/memories (such as any of the memories 130-530 of FIGS. 1-5), or secondary storage/storages. Alternatively, the system 3300 is a data communication system (such as the communication networks 600, 700 of FIGS. 6-7), wherein said one or more memories 3310 may be data buffers associated with transmitting and receiving nodes in the data communication system (such as transmitter 610, 710 and receiver 620, 720 of FIGS. 6-7).

Although the inventive aspects are described using the example embodiments, they are not limited to the disclosed embodiments but they cover alternative embodiments that can be realized by someone skilled in the art.

The invention claimed is:

1. A data compression device for compressing an uncompressed data block that comprises a number n of data values into a compressed data block, the data compression device comprising:
   a compressor configured to compress data values of the uncompressed data block into corresponding variable-length codewords;
   a detector configured to detect the presence of at least one specific data value in the uncompressed data block; and
   a compressed data block generator, coupled to the compressor and the detector and configured to generate the compressed data block by combining:
      a data value mask containing n mask positions, wherein each mask position is indicative of whether or not a respective data value in the uncompressed data block is equal to any of said at least one specific data value, as detected by said detector; and
      for data values in the uncompressed data block which are not equal to said at least one specific data value, the corresponding variable-length codewords as compressed by the compressor,
   wherein the compressed data block comprises the data value mask and m variable-length codewords, where m≤n, and wherein no variable-length codewords for data values in the uncompressed data block which are equal to any of said at least one specific data value are included in the compressed data block.

2. The data compression device as defined in claim 1, wherein the detector is configured to detect the presence of one specific data value in the uncompressed data block, and wherein each of the n mask positions of the data value mask contains a single bit.

3. The data compression device as defined in claim 2, wherein the detector comprises a comparator having:
   a first input configured to receive a data value at a respective data value position in the uncompressed data block;
   a second input configured to receive the specific data value; and
   an output configured to output a result of a comparison between the specific data value and the data value at the respective data value position in the uncompressed data block.

4. The data compression device as defined in claim 3,
wherein the compressed data block generator comprises a mask register having n one-bit storage positions, one for each of the n mask positions of the data value mask, and
   wherein the output of the comparator is coupled to the mask register, such that the mask register is updated at a respective one of its n storage positions with the result of the comparison between the specific data value and the data value at the respective data value position in the uncompressed data block.

5. The data compression device as defined in claim 4, wherein the compressed data block generator comprises a storage unit having:
   a first input configured to receive from the compressor and store in the storage unit a variable-length codeword corresponding to the data value at the respective data value position in the uncompressed data block;
   an output configured to output the stored variable-length codeword into an accumulated variable-length encoding; and
   a second input configured to receive a control signal being dependent on the output of the comparator,
   wherein the storage unit is configured to disable output of the stored variable-length codeword into the variable-length encoding when the result of the comparison by the comparator indicates a match between the specific data value and the data value at the respective data value position in the uncompressed data block.

6. The data compression device as defined in claim 5, wherein the compressed data block generator comprises a concatenator configured to generate the compressed data block by concatenating the data value mask from the mask register and the accumulated variable-length encoding when all n data values of the uncompressed data block have been processed.

7. The data compression device as defined in claim 6, wherein the data value mask precedes the accumulated variable-length encoding in the compressed data block.

8. The data compression device as defined in claim 1, wherein the detector is configured to detect the presence of a plurality of different specific data values in the uncompressed data block, and wherein each of the n mask positions of the data value mask contains a fixed-size bit combination capable of encoding any of the plurality of specific data values.

9. The data compression device as defined in claim 1, wherein the or each of said at least one specific data value is a frequently appearing data value which if instead using variable-length encoding could have been encoded with a minimum of bits.

10. The data compression device as defined in claim 1, wherein the or each of said at least one specific data value is a data value that when occurring requires very fast decompression.

11. The data compression device as defined in claim 1, wherein the or one of said at least one specific data value is 0.

12. A data compression method for compressing an uncompressed data block that comprises a predetermined number n of data values into a compressed data block, the data compression method comprising:
   compressing data values of the uncompressed data block into corresponding variable-length codewords;
   detecting the presence of at least one specific data value in the uncompressed data block; and
   generating the compressed data block by combining:
      a data value mask containing n mask positions, wherein each mask position is indicative of whether or not a respective data value in the uncompressed data block is equal to any of said at least one specific data value; and
      for data values in the uncompressed data block which are not equal to any of said at least one specific data value, the corresponding variable-length codewords,
   wherein the compressed data block comprises the data value mask and m variable-length codewords, where m≤n, and wherein no variable-length codewords for data values in the uncompressed data block which are equal to any of said at least one specific data value are included in the compressed data block.

13. A data decompression device for decompressing a compressed data block into a decompressed data block that comprises a number n of data values at respective data value positions, the data decompression device comprising:
   a decompressor configured to decompress variable-length codewords of the compressed data block into corresponding decompressed data values; and
   a decompressed data block generator configured to:
   read a data value mask containing n mask positions from the compressed data block, wherein each mask position is indicative of whether or not a respective data value in an uncompressed data block prior to data compression which produced the compressed data block was equal to any of at least one specific data value; and
   based on the data value mask, generate the decompressed data block by combining decompressed data values from the decompressor and said at least one specific data value as indicated by respective mask positions of the data value mask,
   wherein the order of the data values of the generated decompressed data block is the same as the order in which the data values appeared in the uncompressed data block prior to the data compression.

14. The data decompression device as defined in claim 13, wherein each of the n mask positions of the data value mask contains a single bit indicative or non-indicative of one specific data value.

15. The data decompression device as defined in claim 14, wherein the decompressed data block generator comprises:
   a value location generator;
   a value location assigner; and
   a plurality of selectors, one for each of the n data value positions of the decompressed data block, wherein the value location generator is configured to control the value location assigner and the plurality of selectors, such that when a respective mask position of the data value mask indicates the specific data, the specific data value is received from the respective selector and included in the decompressed data block at the respective data value position, and such that when the respective mask position of the data value mask does not indicate the specific data value, a corresponding decompressed data value is received from the decompressor and is included in the decompressed data block at the respective data value position.

16. The data decompression device as defined in claim 13, wherein each of the n mask positions of the data value mask contains a fixed-size bit combination capable of decoding any of a plurality of specific data values.

17. The data decompression device as defined in claim 13, wherein the or one of said at least one specific data value is 0.

18. A system comprising one or more memories, a data compression device according to claim 1 and a data decompression device according to claim 13.

19. The system as defined in claim 18, wherein the system is a computer system and wherein said one or more memories are from the group consisting of:
   cache memories,
   random access memories, and
   secondary storages.

20. The system as defined in claim 18, wherein the system is a data communication system and wherein said one or more memories are data buffers.

21. A data decompression method for decompressing a compressed data block into a decompressed data block that comprises a number n of data values at respective data value positions, the data decompression method comprising:
   decompressing variable-length codewords of the compressed data block into corresponding decompressed data values;
   reading a data value mask containing n mask positions from the compressed data block, wherein each mask position is indicative of whether or not a respective data value in an uncompressed data block prior to data compression which produced the compressed data block was equal to any of at least one specific data value; and
   based on the data value mask, generating the decompressed data block by combining decompressed data values and said at least one specific data value as indicated by respective mask positions of the data value mask,
   wherein the order of the data values of the generated decompressed data block is the same as the order in which the data values appeared in the uncompressed data block prior to the data compression.

22. A data compression device for compressing an uncompressed data block that comprises a number n of data values into a compressed data block, the data compression device comprising:
   a compressor configured to compress data values of the uncompressed data block into corresponding variable-length codewords;
   a detector configured to detect the presence of at least one specific data value in the uncompressed data block; and a compressed data block generator, coupled to the compressor and the detector and configured to generate a data value mask containing n mask positions, wherein each mask position is indicative of whether or not a respective data value in the uncompressed data block is equal to any of said at least one specific data value, as detected by said detector, wherein the compressed data block generator comprises a mask encoding generator configured to:
    analyze the generated data value mask including determining whether it matches with any of a plurality of mask patterns; and
    generate a mask encoding to represent an outcome of the analysis;

wherein the compressed data block generator is further configured to generate the compressed data block by combining at least:
    the generated mask encoding; and
    for data values in the uncompressed data block which are not equal to any of said at least one specific data value, the corresponding variable-length codewords as compressed by the compressor,
    wherein the compressed data block comprises the generated mask encoding and m variable-length codewords, where m≤n, and wherein no variable-length codewords for data values in the uncompressed data block which are equal to any of said at least one specific data value are included in the compressed data block, and
    wherein the compressed data block further comprises the data value mask, unless the outcome of the analysis by the mask encoding generator is that the generated data value mask indicates a predefined repetitive pattern of specific data values in the uncompressed data block.

23. The data compression device as defined in claim 22, wherein the mask encoding generator is configured to generate the mask encoding to have a first mask encoding value when the generated data value mask indicates a predefined repetitive pattern of specific data values at every second data value position in the uncompressed data block, and wherein only the mask encoding but not the data value mask is included in the generated compressed data block.

24. The data compression device as defined in claim 23, wherein the mask encoding generator is configured to generate the mask encoding to have a second mask encoding value when the generated data value mask indicates a predefined repetitive pattern of specific data values at every second data value position in the uncompressed data block, however at a one-position offset with respect to the predefined repetitive pattern of the first mask encoding value, and wherein only the mask encoding but not the data value mask is included in the generated compressed data block.

25. The data compression device as defined in claim 24, wherein the mask encoding generator is configured to generate the mask encoding to have a third mask encoding value when the generated data value mask indicates presence of a specific data value in at least one data value position in the uncompressed data block, and wherein the mask encoding as well as the data value mask is included in the generated compressed data block.

26. The data compression device as defined in claim 25, wherein the mask encoding generator is configured to generate the mask encoding to have a fourth mask encoding value when the generated data value mask indicates absence of specific data values in all data value positions in the uncompressed data block, and wherein only the mask encoding but not the data value mask is included in the generated compressed data block.

27. The data compression device as defined in claim 22, wherein the mask encoding precedes the m variable-length codewords in the compressed data block, and wherein the data value mask, if any, is provided after the mask encoding and before the m variable-length codewords in the compressed data block.

28. A data compression method for compressing an uncompressed data block that comprises a number n of data values into a compressed data block, the data compression method comprising:
    compressing data values of the uncompressed data block into corresponding variable-length codewords;
    detecting the presence of at least one specific data value in the uncompressed data block;
    generating a data value mask containing n mask positions, wherein each mask position is indicative of whether or not a respective data value in the uncompressed data block is equal to any of said at least one specific data value;
    analyzing the generated data value mask including determining whether it matches with any of a plurality of mask patterns;
    generating a mask encoding to represent an outcome of the analysis; and
    generating the compressed data block by combining at least:
        the generated mask encoding; and
        for data values in the uncompressed data block which are not equal to any of said at least one specific data value, the corresponding variable-length codewords as compressed by the compressor,
    wherein the compressed data block comprises the generated mask encoding and m variable-length codewords, where 0≤m≤n, and wherein no variable-length codewords for data values in the uncompressed data block which are equal to any of said at least one specific data value are included in the compressed data block, and
    wherein the compressed data block further comprises the data value mask, unless the outcome of the analyzing step is that the generated data value mask indicates a predefined repetitive pattern of specific data values in the uncompressed data block.

29. A data decompression device for decompressing a compressed data block into a decompressed data block that comprises a number n of data values at respective data value positions, the data decompression device comprising:
    a decompressor configured to decompress variable-length codewords of the compressed data block into corresponding decompressed data values; and
    a decompressed data block generator configured to:
    read a mask encoding from the compressed data block, the mask encoding representing any of a plurality of mask patterns;
    when the mask pattern represented by the read mask encoding does not indicate a predefined repetitive pattern of any of at least one specific data value in an uncompressed data block prior to data compression which produced the compressed data block, read a data value mask containing n mask positions from the compressed data bloc, wherein each mask position is indicative of whether or not a respective data value in the uncompressed data block prior to data compression was equal to any of said at least one specific data value; and
    based on the mask encoding, and the data value mask if applicable, generate the decompressed data block by combining decompressed data values from the decompressor and said at least one specific data value as indicated by the predefined repetitive pattern represented by the mask encoding, or as indicated by respective mask positions of the data value mask if applicable, wherein the order of the data values of the generated decompressed data block is the same as the order in which the data values appeared in the uncompressed data block prior to the data compression.

30. The data decompression device as defined in claim 29, wherein the decompressed data block generator is configured, when the read mask encoding has a first mask encoding value, to generate the decompressed data block by combining decompressed data values from the decompressor and said at least one specific data value in a predefined repetitive pattern with specific data values at every second data value position in the decompressed data block.

31. The data decompression device as defined in claim 30, wherein the decompressed data block generator is configured, when the read mask encoding has a second mask encoding value, to generate the decompressed data block by combining decompressed data values from the decompressor and said at least one specific data value in a predefined repetitive pattern with specific data values at every second data value position in the decompressed data block, however at a one-position offset with respect to the predefined repetitive pattern of the first mask encoding value.

32. The data decompression device as defined in claim 31, wherein the decompressed data block generator is configured, when the read mask encoding has a third mask encoding value, to generate the decompressed data block by combining decompressed data values from the decompressor and said at least one specific data value as indicated by the respective mask positions of the data value mask.

33. The data decompression device as defined in claim 32, wherein the decompressed data block generator is configured, when the read mask encoding has a fourth mask encoding value, to generate the decompressed data block to contain all decompressed data values from the decompressor.

34. A data decompression method for decompressing a compressed data block into a decompressed data block that comprises a number n of data values at respective data value positions, the data decompression method comprising:
   decompressing variable-length codewords of the compressed data block into corresponding decompressed data values;
   reading a mask encoding from the compressed data block, the mask encoding representing any of a plurality of mask patterns;
   when the mask pattern represented by the read mask encoding does not indicate a predefined repetitive pattern of any of at least one specific data value in an uncompressed data block prior to data compression which produced the compressed data block, reading a data value mask containing n mask positions from the compressed data block, wherein each mask position is indicative of whether or not a respective data value in the uncompressed data block prior to data compression was equal to any of said at least one specific data value; and
   based on the mask encoding, and the data value mask if applicable, generating the decompressed data block by combining decompressed data values and said at least one specific data value as indicated by the predefined repetitive pattern represented by the mask encoding, or as indicated by respective mask positions of the data value mask if applicable,
   wherein the order of the data values of the generated decompressed data block is the same as the order in which the data values appeared in the uncompressed data block prior to the data compression.

35. A data compression device for compressing an uncompressed data block that comprises a number n of data values into a compressed data block, the data compression device comprising:
   a compressor configured to compress data values of the uncompressed data block into corresponding variable-length codewords, and output said variable-length codewords-as well as respective code lengths thereof;
   a compressed data block generator, coupled to the compressor and comprising a length mask register having n storage positions, one for each of the n data values of the uncompressed data block, the length mask register being configured for storing an n-position length mask,
   wherein the compressed data block generator is configured to store, at respective positions in the length mask, the respective code lengths of variable-length codewords as provided by the compressor, and
   wherein the compressed data block generator is configured to generate the compressed data block by combining:
      the length mask stored in the length mask register; and
      compressed data values in the form of the variable-length codewords as provided by the compressor.

36. The data compression device as defined in claim 35, wherein the length mask precedes the variable-length codewords in the compressed data block.

37. The data compression device as defined in claim 35, further comprising a detector coupled to the compressor and configured to detect data values of the uncompressed data block that cannot be compressed by said compressor,
   wherein the compressed data block generator is configured to store, at a respective position in the length mask, a code length having a special value when the detector has detected that a data value of the uncompressed data block cannot be compressed, and store this data value uncompressed in the compressed data block.

38. The data compression device as defined in claim 37, wherein the special value of the code length is 0.

39. The data compression device as defined in claim 37, wherein the detector is configured to detect data values of the uncompressed data block that cannot be compressed by said compressor as one or more of the following:
   data values which do not exist in a code table of the compressor,
   data values which exist in the code table but lack codewords in the code table of the compressor,
   data values which exist in the code table, have codewords therein but are indicated as invalid in the code table of the compressor.

40. The data compression device as defined in claim 37, wherein the compressed data block generator is configured to generate the compressed data block by including compressed data values in the form of the variable-length codewords as provided by the compressor and uncompressed data values as detected by the detector in the order of the data values of the uncompressed data block.

41. The data compression device as defined in claim 37, wherein the compressed data block generator is configured to generate the compressed data block by including first the compressed data values in the form of the variable-length codewords as provided by the compressor in the order of the data values of the uncompressed data block and then the uncompressed data values as detected by the detector, or vice versa, wherein the order of all respective code lengths in the length mask follows the order of all data values of the uncompressed data block, thereby allowing reconstruction of all data values in the original order of the uncompressed data block during decompression of the compressed data block.

42. The data compression device as defined in claim 41, wherein the uncompressed data values are stored in reversed order in the generated compressed data block compared to their order in the uncompressed data block.

43. A data compression method for compressing an uncompressed data block that comprises a number n of data values into a compressed data block, the data compression method comprising:
   compressing data values of the uncompressed data block into corresponding variable-length codewords, and outputting said variable-length codewords as well as respective code lengths thereof;
   storing an n-position length mask in a length mask register having n storage positions, one for each of the n data values of the uncompressed data block,
   storing, at respective positions in the length mask, the respective code lengths of variable-length codewords, and
   generating the compressed data block by combining:
      the length mask stored in the length mask register; and
      compressed data values in the form of the variable-length codewords.

44. A data decompression device for decompressing a compressed data block into a decompressed data block that comprises a number n of data values at respective data value positions, the data decompression device comprising:
   a decompressor configured to decompress variable-length codewords of the compressed data block into corresponding decompressed data values;
   an extractor mechanism for reading an n-position length mask from the compressed data block, determining from the length mask respective code lengths of variable-length codewords in the compressed data block, extracting respective variable-length codewords from the compressed data block based on the determined respective code lengths, and providing the extracted respective variable-length codewords to the decompressor; and
   a decompressed data block generator configured to generate the decompressed data block from the decompressed data values from the decompressor,
   wherein the order of the data values of the generated decompressed data block is the same as the order in which the data values appeared in the uncompressed data block prior to data compression.

45. The data decompression device as defined in claim 44, wherein the decompressed data block generator is configured to:
   detect, for one or more positions in the length mask, one or more code lengths having a special value indicating that one or more corresponding data values is/are included in uncompressed form in the compressed data block; and
   based on the detected one or more code lengths having the special value, generate the decompressed data block by combining decompressed data values from the decompressor and the one or more corresponding data values in uncompressed form from the compressed data block.

46. The data decompression device as defined in claim 45, wherein the special value of code lengths is 0.

47. A data decompression method for decompressing a compressed data block into a decompressed data block that comprises a number n of data values at respective data value positions, the data decompression method comprising:
   reading an n-position length mask from the compressed data block;
   determining from the length mask respective code lengths of variable-length codewords in the compressed data block;
   extracting respective variable-length codewords from the compressed data block based on the determined respective code lengths;
   decompressing the extracted variable-length codewords into corresponding decompressed data values; and
   generating the decompressed data block from the decompressed data values,
   wherein the order of the data values of the generated decompressed data block is the same as the order in which the data values appeared in the uncompressed data block prior to data compression.

48. One or more non-transitory computer readable media storing processor executable instructions which, when executed by at least one processor, cause the at least one processor to:
   compress data values of the uncompressed data block into corresponding variable-length codewords;
   detect the presence of at least one specific data value in the uncompressed data block; and
   generate the compressed data block by combining:
      a data value mask containing n mask positions, wherein each mask position is indicative of whether or not a respective data value in the uncompressed data block is equal to any of said at least one specific data value; and
      for data values in the uncompressed data block which are not equal to any of said at least one specific data value, the corresponding variable-length codewords,
   wherein the compressed data block comprises the data value mask and m variable-length codewords, where m≤n, and wherein no variable-length codewords for data values in the uncompressed data block which are equal to any of said at least one specific data value are included in the compressed data block.

49. One or more non-transitory computer readable media storing processor executable instructions which, when executed by at least one processor, cause the at least one processor to:
   decompress variable-length codewords of the compressed data block into corresponding decompressed data values;
   read a data value mask containing n mask positions from the compressed data block, wherein each mask position is indicative of whether or not a respective data value in an uncompressed data block prior to data compression which produced the compressed data block was equal to any of at least one specific data value; and
   based on the data value mask, generate the decompressed data block by combining decompressed data values and said at least one specific data value as indicated by respective mask positions of the data value mask,
   wherein the order of the data values of the generated decompressed data block is the same as the order in which the data values appeared in the uncompressed data block prior to the data compression.

50. A system comprising one or more memories, a data compression device for compressing an uncompressed data block that comprises a number n of data values into a compressed data block, the data compression device comprising:
- a compressor configured to compress data values of the uncompressed data block into corresponding variable-length codewords;
- a detector configured to detect the presence of at least one specific data value in the uncompressed data block; and
- a compressed data block generator, coupled to the compressor and the detector and configured to generate a data value mask containing n mask positions, wherein each mask position is indicative of whether or not a respective data value in the uncompressed data block is equal to any of said at least one specific data value, as detected by said detector,
- wherein the compressed data block generator comprises a mask encoding generator configured to:
- analyze the generated data value mask including determining whether it matches with any of a plurality of mask patterns; and
- generate a mask encoding to represent an outcome of the analysis;
- wherein the compressed data block generator is further configured to generate the compressed data block by combining at least:
  - the generated mask encoding; and
  - for data values in the uncompressed data block which are not equal to any of said at least one specific data value, the corresponding variable-length codewords as compressed by the compressor,
- wherein the compressed data block comprises the generated mask encoding and m variable-length codewords, where m≤n, and wherein no variable-length codewords for data values in the uncompressed data block which are equal to any of said at least one specific data value are included in the compressed data block, and
- wherein the compressed data block further comprises the data value mask, unless the outcome of the analysis by the mask encoding generator is that the generated data value mask indicates a predefined repetitive pattern of specific data values in the uncompressed data block;

and a data decompression device for decompressing a compressed data block into a decompressed data block that comprises a number n of data values at respective data value positions, the data decompression device comprising:
- a decompressor configured to decompress variable-length codewords of the compressed data block into corresponding decompressed data values; and
- a decompressed data block generator configured to:
- read a mask encoding from the compressed data block, the mask encoding representing any of a plurality of mask patterns;
- when the mask pattern represented by the read mask encoding does not indicate a predefined repetitive pattern of any of at least one specific data value in an uncompressed data block prior to data compression which produced the compressed data block, read a data value mask containing n mask positions from the compressed data bloc, wherein each mask position is indicative of whether or not a respective data value in the uncompressed data block prior to data compression was equal to any of said at least one specific data value; and
- based on the mask encoding, and the data value mask if applicable, generate the decompressed data block by combining decompressed data values from the decompressor and said at least one specific data value as indicated by the predefined repetitive pattern represented by the mask encoding, or as indicated by respective mask positions of the data value mask if applicable,
- wherein the order of the data values of the generated decompressed data block is the same as the order in which the data values appeared in the uncompressed data block prior to the data compression.

51. The system as defined in claim 50, wherein the system is a computer system and wherein said one or more memories are from the group consisting of:
cache memories,
random access memories, and
secondary storages.

52. The system as defined in claim 50, wherein the system is a data communication system and wherein said one or more memories are data buffers.

53. A system comprising one or more memories, a data compression device for compressing an uncompressed data block that comprises a number n of data values into a compressed data block, the data compression device comprising:
- a compressor configured to compress data values of the uncompressed data block into corresponding variable-length codewords, and output said variable-length codewords-as well as respective code lengths thereof;
- a compressed data block generator, coupled to the compressor and comprising a length mask register having n storage positions, one for each of the n data values of the uncompressed data block, the length mask register being configured for storing an n-position length mask,
- wherein the compressed data block generator is configured to store, at respective positions in the length mask, the respective code lengths of variable-length codewords as provided by the compressor, and
- wherein the compressed data block generator is configured to generate the compressed data block by combining:
  - the length mask stored in the length mask register; and
  - compressed data values in the form of the variable-length codewords as provided by the compressor; and a data decompression device for decompressing a compressed data block into a decompressed data block that comprises a number n of data values at respective data value positions, the data decompression device comprising:
- a decompressor configured to decompress variable-length codewords of the compressed data block into corresponding decompressed data values;
- an extractor mechanism for reading an n-position length mask from the compressed data block, determining from the length mask respective code lengths of variable-length codewords in the compressed data block, extracting respective variable-length codewords from the compressed data block based on the determined respective code lengths, and providing the extracted respective variable-length codewords to the decompressor; and
- a decompressed data block generator configured to generate the decompressed data block from the decompressed data values from the decompressor,
- wherein the order of the data values of the generated decompressed data block is the same as the order in which the data values appeared in the uncompressed data block prior to data compression.

54. The system as defined in claim 53, wherein the system is a computer system and wherein said one or more memories are from the group consisting of:

cache memories,
random access memories, and
secondary storages.

55. The system as defined in claim 53, wherein the system is a data communication system and wherein said one or more memories are data buffers.

56. One or more non-transitory computer readable media storing processor executable instructions which, when executed by at least one processor, cause the at least one processor to:
   compress data values of the uncompressed data block into corresponding variable-length codewords;
   detect the presence of at least one specific data value in the uncompressed data block;
   generate a data value mask containing n mask positions, wherein each mask position is indicative of whether or not a respective data value in the uncompressed data block is equal to any of said at least one specific data value;
   analyze the generated data value mask including determining whether it matches with any of a plurality of mask patterns;
   generate a mask encoding to represent an outcome of the analysis; and
   generate the compressed data block by combining at least:
      the generated mask encoding; and
      for data values in the uncompressed data block which are not equal to any of said at least one specific data value, the corresponding variable-length codewords as compressed by the compressor,
   wherein the compressed data block comprises the generated mask encoding and m variable-length codewords, where 0≤m≤n, and wherein no variable-length codewords for data values in the uncompressed data block which are equal to any of said at least one specific data value are included in the compressed data block, and
   wherein the compressed data block further comprises the data value mask, unless the outcome of the analyzing step is that the generated data value mask indicates a predefined repetitive pattern of specific data values in the uncompressed data block.

57. One or more non-transitory computer readable media storing processor executable instructions which, when executed by at least one processor, cause the at least one processor to:
   decompress variable-length codewords of the compressed data block into corresponding decompressed data values;
   read a mask encoding from the compressed data block, the mask encoding representing any of a plurality of mask patterns;
   when the mask pattern represented by the read mask encoding does not indicate a predefined repetitive pattern of any of at least one specific data value in an uncompressed data block prior to data compression which produced the compressed data block, read a data value mask containing n mask positions from the compressed data block, wherein each mask position is indicative of whether or not a respective data value in the uncompressed data block prior to data compression was equal to any of said at least one specific data value; and
   based on the mask encoding, and the data value mask if applicable, generate the decompressed data block by combining decompressed data values and said at least one specific data value as indicated by the predefined repetitive pattern represented by the mask encoding, or as indicated by respective mask positions of the data value mask if applicable,
   wherein the order of the data values of the generated decompressed data block is the same as the order in which the data values appeared in the uncompressed data block prior to the data compression.

58. One or more non-transitory computer readable media storing processor executable instructions which, when executed by at least one processor, cause the at least one processor to:
   compress data values of the uncompressed data block into corresponding variable-length codewords, and outputting said variable-length codewords as well as respective code lengths thereof;
   store an n-position length mask in a length mask register having n storage positions, one for each of the n data values of the uncompressed data block,
   store, at respective positions in the length mask, the respective code lengths of variable-length codewords, and
   generate the compressed data block by combining:
      the length mask stored in the length mask register; and
      compressed data values in the form of the variable-length codewords.

59. One or more non-transitory computer readable media storing processor executable instructions which, when executed by at least one processor, cause the at least one processor to:
   read an n-position length mask from the compressed data block;
   determine from the length mask respective code lengths of variable-length codewords in the compressed data block;
   extract respective variable-length codewords from the compressed data block based on the determined respective code lengths;
   decompress the extracted variable-length codewords into corresponding decompressed data values; and
   generate the decompressed data block from the decompressed data values,
   wherein the order of the data values of the generated decompressed data block is the same as the order in which the data values appeared in the uncompressed data block prior to data compression.

* * * * *